United States Patent
Fala et al.

(10) Patent No.: US 7,356,077 B2
(45) Date of Patent: Apr. 8, 2008

(54) METHOD AND APPARATUS FOR TESTING NETWORK INTEGRITY

(75) Inventors: Joseph M. Fala, Honolulu, HI (US); Luis A. Wills, Honolulu, HI (US)

(73) Assignee: Spirent Communications Inc., Calabasas, CA (US)

(*) Notice: Subject to any disclaimer, the term of this patent is extended or adjusted under 35 U.S.C. 154(b) by 642 days.

(21) Appl. No.: 10/236,124

(22) Filed: Sep. 6, 2002

(65) Prior Publication Data

US 2003/0048500 A1 Mar. 13, 2003

Related U.S. Application Data

(63) Continuation-in-part of application No. 10/236,822, filed on Sep. 5, 2002.

(60) Provisional application No. 60/318,178, filed on Sep. 7, 2001.

(51) Int. Cl.
*H04B 3/14* (2006.01)

(52) U.S. Cl. ............... 375/224; 375/226; 375/361; 375/371; 375/374; 375/375; 329/302; 370/516; 702/69

(58) Field of Classification Search ........... 375/219, 375/361, 374, 375, 376, 226; 370/217, 233; 331/17; 709/224; 324/76.77; 329/302
See application file for complete search history.

(56) References Cited

U.S. PATENT DOCUMENTS

| | | | |
|---|---|---|---|
| 4,180,779 A * | 12/1979 | Hook et al. | 329/307 |
| 4,682,117 A * | 7/1987 | Gibson | 329/302 |
| 5,121,342 A * | 6/1992 | Szymborski et al. | 709/224 |
| 5,399,995 A * | 3/1995 | Kardontchik et al. | 331/17 |
| 5,479,120 A | 12/1995 | McEwan | |

| | | | |
|---|---|---|---|
| 6,795,496 B1 * | 9/2004 | Soma et al. | 375/226 |

(Continued)

OTHER PUBLICATIONS

I. Bar-David, Direct differential detection of phase-shift-keyed signals: a local-oscillator less DPSK receiver, Feb. 1994, Optoelectronics, IEE Proceedings, vol. 141, Issue 1, pp. 38-42.*

(Continued)

*Primary Examiner*—David C. Payne
*Assistant Examiner*—Adolf DSouza
(74) *Attorney, Agent, or Firm*—Gilberto M. Villacorta; Phillip J. Articola; Foley & Lardner LLP

(57) ABSTRACT

Apparatuses and methods for testing the integrity of high speed optical fiber transmission networks are presented. Data from an optical network, for example, NRZ formatted data at forty gigabits per second and higher may be reliably recovered using embodiments of the invention. The invention employs hybrid microwave and high speed processing technology to reliably measure the phase shift of the data transmitted over a high speed optical transmission network by comparing the incoming data to a super-stable clock/frequency reference. The clock/frequency reference is intentionally offset by fractional frequency resulting in a beat frequency when compared to the incoming data. The beat frequency provides the ability for automatic calibration of the phase measurements because the period of the full 360 degrees phase is known. Also, the invention provides reliable means for measuring jitter and for generating Eye-pattern diagrams by eliminating issues associated with oscilloscope loop bandwidth limitations. Additionally, the phase of an incoming data and the time of the phase are available from measurements using high speed samplers.

1 Claim, 16 Drawing Sheets

U.S. PATENT DOCUMENTS

2001/0019441 A1* 9/2001 Kogure et al. .............. 359/158
2003/0056157 A1* 3/2003 Fala et al. ................. 714/700

OTHER PUBLICATIONS

Ingo Cyliax, CORDIC, Coordinate Rotation Digital Computer, Mar. 1997, http://www.ee.ualberta.ca/courses/ee401/microboard/cordic_CCink.html).*

Riley et al., A simplified continuous phase modulator technique, May 1994, IEEE Transactions on Circuits and Systems II, vol. 41, pp. 321-328.*

Takahashi et al., A direct conversion receiver utilizing a novel FSK demodulator and a low-power-consumption quadrature mixer, May 10-13, 1992, IEEE VTC, vol. 2, pp. 910-915).*

Dan Wolaver, Tektronix Digital Jitter Analysis—The Next Generation of Testing, Specification, 15 pages.

Huiqing Zhong, et al, Monothic Clock and Data Recovery Chip for 10GB/S Fiber Communications Systems, Final Report, 1997-98, 4 pages, Micro Project #97-105, University of California, Santa Barbara, CA.

Marki Microwave, 7 pages, Morgan Hill, CA.

Leading the Way with Innovative Jitter & Wander Test Solutions, Application Note 71, 32 pages, Wandel & Goltermann.

Crosstalk and Jitter Measurements, 15 pages [Internet: http://www.iol.unh.edu/training/tokenring/vjs_thesis/vjthes5.html], retrieved Jul. 20, 2001.

Chapter III—Jitter Measurement at the IOL, 4 pages [Internet: http://www.iol.unh.edu/training/tokenring/vjs_thesis/vjthes3.html], retrieved Jul. 20, 2001.

Chapter IV—Accuracy of the Measurement Set-Up, 12 pages [Internet: http://www.iol.unh.edu/training/tokenring/vjs_thesis/vjthes4.html], retrieved Jul. 20, 2001.

Chapter VI—Reflections and Jitter, 10 pages [Internet: http://www.iol.unh.edu/training/tokenring/vjs_thesis/vjthes6.html], retrieved Jul. 20, 2001.

Chapter VII—Conclusions and Recommendations, 4 pages [Internet: http://www.iol.unh.edu/training/tokenring/vjs_thesis/vjthes7.html], retrieved Jul. 20, 2001.

* cited by examiner

| Signal | Minimum peak-to-peak jitter/Wander amplitude (UIpp) | | | | | Jitter/Wander Frequency Breakpoints (Hz) | | | | | | | | | |
|---|---|---|---|---|---|---|---|---|---|---|---|---|---|---|---|
| | A0 | A1 | A2 | A3 | A4 | f0 | f12 | f11 | f10 | f9 | f8 | f1 | f2 | f3 | f4 |
| OC48 | 57.6 X1000 | 6.4 X1000 | 0.8 | | | 12 micro | 178 micro | 1.6 mH | 15.6 mH | 125 mH | 12.1 Hz | 5 KH | 100 KH | 1 MH | 20 MH |
| OC192 | 230.4 X1000 | 25.6 X1000 | 3.2 | 2 | 0.2 | | | | | | | 10 KH | 400 KH | 4 MH | 80 MH |
| | | | | | | 12 micro | 178 micro | 1.6 mH | 15.6 mH | 125 mH | 12.1 Hz | | | | |
| OC768 | 921.6 X1000 | 102.4 X1000 | 12.8 | 2 | 0.2 | 12 micro | 178 micro | 1.6 mH | 15.6 mH | 125 mH | 12.1 Hz | 80 KH | 1600 KH | 16 MH | 320 MH |

METHOD AND APPARATUS FOR TESTING NETWORK INTEGRITY

This application claims priority to U.S. Provisional Application No. 60/318,178, filed on Sep. 7, 2001, entitled "Method and Apparatus for Testing Network Integrity," and is a Continuation-In-Part of U.S. application Ser. No. 10/236,822 filed on Sep. 5, 2002 entitled "Method and Apparatus for Testing Network Integrity," the specifications of which are herein incorporated by reference.

BACKGROUND OF THE INVENTION

1. Field of the Invention

This invention relates to the field of transport photonics. More specifically the invention relates to physical layer transport testing of the integrity of optical network components.

2. Background Art

Originally, communication networks were constructed of copper wires for the transmission of electrical signals to communicate data and sound. For instance, some cable networks still transmit video and audio communication over copper wires. However, the demand created by a larger number of customers, need for increased programming choices, as well as increased communication distances, resulted in the proliferation of fiber optic transmission networks. This is because electrical signal transmission has very limited data carrying capability (i.e., low bandwidth) in contrast to optical transmission. Moreover, electrical based communication systems suffer from power losses (due to diffusion and skin effect) that accompany copper based transmission lines. Thus, in the telecommunications field, optical fibers and optical fiber cables have become the transmission media of choice, primarily because of the tremendous bandwidth capabilities and low power loss associated with optical fibers.

In current optical fiber communication systems, communication channels typically involve transmitting signals impressed on laser beams having different wavelengths propagating through optical fiber (e.g. Wavelength Division Multiplexing (WDM)). Although optical fiber communication systems utilizing such wavelength-distinct modulated channels may carry information over long distances, signals transmitted through optical fibers are attenuated and may be distorted due to the cumulative and combined effects of absorption and scattering. While the signal attenuation and distortion per kilometer in optical fibers used for communications are typically low, signal distortion becomes a communications factor for signals transmitted over increasing transmission distances especially when data is densely compacted using methods such as Dense Wavelength Division Multiplexing (DWDM).

DWDM is a technology that puts data from different sources together on an optical fiber, with each signal carried on its own separate light wavelength. Using DWDM, up to 80 (and theoretically more) separate wavelengths or channels of data can be multiplexed into a light-stream transmitted on a single optical fiber. Thus, in a system with each channel carrying 2.5 GBPS (billion bits per second), up to 200 billion bits can be delivered a second by the optical fiber. DWDM is also sometimes called wavelength division multiplexing (WDM).

Generally, in order to manage and control multiple wavelength optical systems (e.g. DWDM systems), information may be needed at each optical node regarding the wavelength and power of each wavelength transmitted through the system.

Optical power level and integrity monitoring becomes more critical as system topologies become more complex. Systems that used point-to-point transmissions have become increasingly complex by adding and dropping optical wavelengths, or channels, and mesh topologies, with rings of optical fiber lines for backup. Information obtained in monitoring optical transmission data can be used to change the optical parameters of a system (such as the transmitter power), regulate optical module operation parameters, and ease the fault isolation process (for example, in WDM systems). Nevertheless, in many monitoring systems, power is monitored using a different detector for each light wavelength, which can prove expensive for optical fibers carrying many wavelengths and difficult to use for people who need to maintain optical fiber transmission systems.

While monitoring power is very important, it is also important to verify the integrity of the signal carried in the different wavelengths of the DWDM system. That is, that the light traveling in all the DWDM wavelengths are at the proper height and have the right spectral components. Prior art methods for testing optical transmission integrity have very limited data rate capabilities. For example, current methods try to obtain the high data rate testing capability using Monolithic Microwave Integrated Circuits (MMIC) or high speed silicon-germanium chips. Although, the silicon-germanium chips are very fast, they still must be treated as microwave components and inserted into cavities to prevent resonant excitation thus diminishing the advantages of dye casting (i.e., high speed silicon-germanium chips). Thus, prior art systems that use all microwave components start experiencing serious drawbacks as the data frequency increases. For example, current optical network testing systems employing dye casting only operate reliably on data up to ten gigahertz.

Testing the integrity of optically transmitted data requires recovering clock and data from the input signal. In NRZ (Non-Return to Zero) format input data, the clock is not included in the data stream thus it must be recovered from the knowledge that data transitions occur at the clock frequency. Prior art methods are not reliable in recovering the clock at very high frequencies because of the nature of NRZ data. Because there is no clock in the NRZ data stream, there usually are extended periods of time where there is no data transition thus precluding a reliable means for recovering the clock signal from the incoming data stream in prior art systems. In RZ (Return to Zero) format input data, the clock is included in the data stream thus clock recovery is not necessary.

Thus, a method for reliably recovering the clock and data from a high frequency NRZ data stream is desired. Also, a method for reliably testing the integrity of optical transmission components at high frequencies is desired.

SUMMARY OF THE INVENTION

The various embodiments of the invention described herein are directed to apparatuses and methods for testing the integrity of a network. More specifically, the one or more embodiments of the invention provide a mechanism for testing the physical transmission of data using an improved technique for processing input data streams during network testing.

Such testing is important because network performance, particularly high-speed optical networks, is dependent upon how efficiently data is handled by the network components. Thus, network engineers and others responsible for ensuring the network remains efficient find it helpful to use test devices to analyze the speed and accuracy of the various components and transport mechanisms that make up the network. In so doing, network problems can be proactively identified and resolved before becoming a significant hindrance to network performance. To effectively measure the network performance, the test device itself must be able to keep up with the transmission speeds of these components and the data traveling across the network. Because some networks (e.g., optical networks) function at very high speeds it is of the utmost importance that the test equipment be able to effectively handle certain tasks related to the processing of an input data stream. Embodiments of the invention provide embed such functionality into an optical spectrum analyzer configured to test the integrity of an optical transmission. For instance, the optical spectrum analyzer may determine whether the transmitted data is at the right height, has the right spectral component, whether there is smearing, chirping, degrading, or any other type of distortion in the transmitted data.

For data integrity testing, different colors of light may be included in one pipe to allow detailed examination of each color. One type of testing may be for extinction ratio which means, the quotient of the power level of one minus the power level of zero over the power level of zero minus the power level of no light. The other photonic testing issue may be determining whether the light signal is traveling correctly down the fiber optic network. For instance, each signal may be examined for amplitude and time variance. These tests, known as Eye, Q, and Jitter characteristics, typically require first converting the incoming optical data to electrical signals for processing. Jitter is the time movement of the signal (e.g., phase modulation), Q is the amplitude movement of the signal (e.g., amplitude modulation), and Eye is known in the art as the Eye-pattern test which is the capability to detect at the middle of the bit window and at the middle of the amplitude threshold of that bit window. For network integrity, it's critical that the data not contain too much jitter, that any amplitude modulation is minimal, that the Eye-pattern is well behaved, and that the wavelengths are in the right place. Thus, an accurate method of measuring network component integrity for high-speed data transmission is presented by embodiments of the invention.

To accomplish these data integrity tests the test equipment embodying the invention is configured to effectively handle clock recovery, data recovery, and jitter measurement of an input data stream obtained from a high-speed network.

One example of a specific type of input data stream embodiments of the invention can handle is called non-return to zero (NRZ) data. NRZ data refers to a form of digital data transmission in which the binary low and high states, represented by numerals 0 and 1, are transmitted by specific and constant DC (direct-current) voltages. One embodiment of the invention provides reliable means for recovering NRZ data from an optical network at speeds of forty gigabits per second and higher. Typically, NRZ data appears in random bit patterns with transitions occurring at the clock frequency, however, there is no clock at that frequency. However, since determination of the clock is necessary for data recovery and other integrity testing functions, the clock must be recovered from available bit patterns.

An embodiment of the invention uses hybrid microwave and high speed processing technology to reliably measure the phase shift of the data transmitted over a high speed optical transmission network and then using the phase error to provide an adjustment voltage to a very reliable clock generating device, for example, a Dielectric Resonator Oscillator (DRO).

In one embodiment of the invention, the recovered clock is used to recover the data transmitted over the high-speed network using high speed processing devices. The integrity of the recovered data can then be analyzed after the data has been properly recovered.

An embodiment of the invention uses hybrid microwave and high speed processing technology to reliably measure the jitter in a high-speed optical transmission network. Jitter measurement involves generating the phase error by comparing, in a device such as a quadrature mixer or a high speed sampler, a clock extracted from the incoming data against a super-stable clock/frequency reference which has a frequency that is offset from the extracted clock. The offset of the super-stable clock/frequency reference results in the generation of a beat frequency which provides information needed for automatic calibration of the quadrature signals, for example.

An embodiment of the present invention provides for computation of the phase and sampling of the incoming data with respect to a super-stable clock/frequency reference. The tracking of phase with respect a super-stable clock/frequency reference has multiple advantages over prior art systems for producing and "Eye Diagram". For instance, the snapshots of the incoming data signal using a sampler can be synchronized to the phase tracking in such a way that the voltage level of the incoming data signal is obtained at the moment of the sampling. Since the phase at the sampling interval is known, it is possible to construct the "Eye Diagram" which gives the values of the voltage of the incoming signal at diverse positions with respect to the underlying clock.

Additionally, the present invention resolves prior art issues resulting from limited bandwidths associated with phase locked loops that are in clock recovery loops of oscilloscopes. The present invention has no such bandwidth limitation and does not require recovering the underlying clock of the incoming data. The desired system bandwidth may be controlled by a user who simply inserts a low-pass filter (with the desired bandwidth) to the generated phase angle. Since the desired bandwidth is user controllable, the present invention affords flexibility which is not available in prior art systems.

Thus, embodiments of the invention apply hybrid microwave and high-speed processing technology to provide programmable and adaptable apparatuses for testing the integrity of fiber optic and other network components.

DETAILED DESCRIPTION OF THE INVENTION

Figure 1:
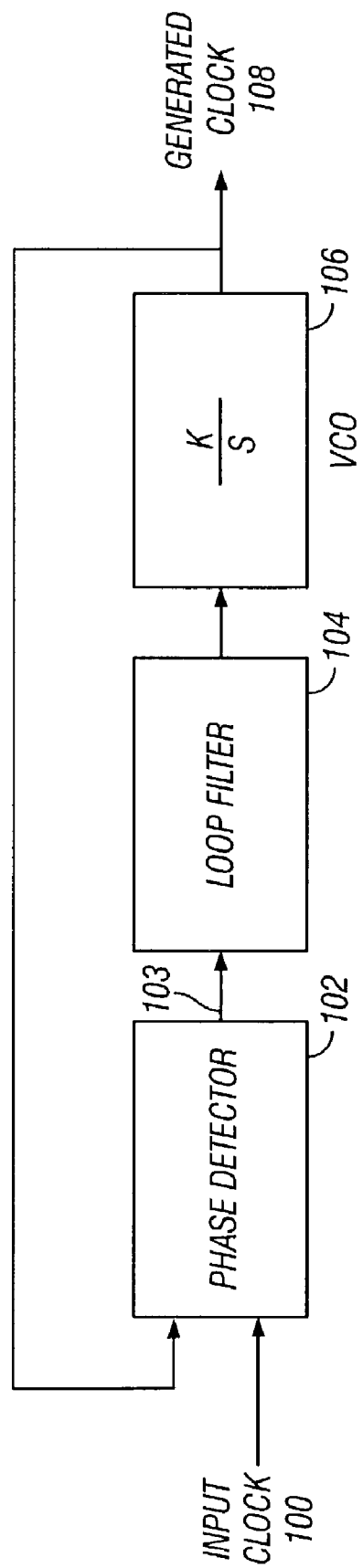
FIG. 1 is a block diagram of a typical phase locked loop.

The invention defines a method and apparatus for physical layer transport testing of optical network components. In the following description, numerous specific details are set forth to provide a more thorough description of embodiments of the invention. It will be apparent, however, to one skilled in the art, that the invention may be practiced without these specific details. In other instances, well known features have not been described in detail so as not to obscure the invention.

One or more embodiments of the invention comprise apparatuses and methods for clock recovery, data recovery, and jitter measurement of an input data stream from a high-speed optical fiber transmission network. Basically, the invention involves testing the integrity of optical network components. That is, testing of the physical transmission of optical data through optical fiber. Two photonics issues are involved in the transmission of optics and data. One of the issues is the integrity of the light traveling in all the different DWDM (dense wavelength division multiplexing) wavelengths. Thus, an embodiment of the invention may be implemented in an optical spectrum analyzer for testing the integrity of the transmission, e.g., whether the transmitted data is at the right height, has the right spectral component, whether there is smearing, chirping, degrading, or any other type of distortion in the transmitted data.

For data integrity testing, different colors of light may be included in one pipe to allow detailed examination of each color. One type of testing may be for extinction ratio which means, the quotient of the power level of one minus the power level of zero over the power level of zero minus the power level of no light. The other photonic testing issue may be determining whether the light signal is traveling correctly down the fiber optic network. For instance, each signal may be examined for amplitude and time variance. These tests, known as Eye, Q, and Jitter characteristics, typically require first converting the incoming optical data to electrical signals for processing. Jitter is the time movement of the signal (e.g., phase modulation), Q is the amplitude movement of the signal (e.g., amplitude modulation), and Eye is known in the art as the Eye-pattern test which is the capability to detect at the middle of the bit window and at the middle of the amplitude threshold of that bit window. For network integrity, it's critical that the data not contain too much jitter, that any amplitude modulation is minimal, that the Eye-pattern is well behaved, and that the wavelengths are in the right place. Thus, an accurate method of measuring network component integrity for high-speed data transmission is presented by embodiments of the invention.

Embodiments of the invention provide methods and apparatuses for measuring the integrity of optical transmission components at very high frequencies. For instance, the data to be tested may be a bitstream in the NRZ (non-return to zero) format at 40 gigabits per second and higher. However, other embodiments may test RZ (return to zero) data at high frequencies.

NRZ data appears in random bit patterns with transitions occurring at the clock frequency although it does not actually contain the underlying data clock. However, because some integrity testing functions require knowledge of the underlying data clock, one or more embodiments of the present invention provide methods and apparatuses for recovering clock from available bit patterns in the NRZ data. Clock determination or recovery is generally accomplished using circuits known in the art as phase locked loops (PLLs).

A PLL is a closed loop feedback system where the frequency of one signal (the clock pulses from the output of a variable frequency generator) is controlled by varying the input to a variable frequency generator so that its output is locked in phase with the clock frequency from a reference source (e.g., the input data stream). This is accomplished by comparing the phase of the input data clock with the phase of the output of a Voltage Controlled Oscillator (VCO) (where the VCO is the variable frequency generator) in order to generate a phase error signal. The phase error signal is conditioned and used to adjust the VCO until the frequency of the VCO matches the frequency of the input clock.

FIG. 1 is a block diagram of a typical phase locked loop. The input to the PLL is the clock of the input data stream (e.g., input clock 100). The Phase Detector, block 102, compares output of the generated frequency from the Voltage Controlled Oscillator 106 (VCO) with input clock 100 to generate the phase error between the two signals. The VCO generally acts like an integrator thereby forcing the phase error, 103, to zero in a steady state. For loop stability, phase error 103 is filtered in block 104 before being used to adjust VCO 106. When the loop stabilizes, generated clock 108, which is the output of block 106, is locked in phase (i.e. there is no phase difference) with the input data clock.

Filter block 104 is also necessary because a typical phase detector does not generate a "DC" error voltage but rather a pulsed waveform depending on the loop lock situation. For example the Motorola MC145170 PD output is a logic level signal with positive or negative going pulses (depending on how the chip is programmed). If this waveform were applied directly to the VCO a broad, frequency modulated signal would result. Therefore, the loop filter averages the phase detector output to produce a smooth voltage error for tuning the VCO.

For high speed clock and data recovery, especially in the 40 gigabits per second range, microwave components are required. However, microwave components alone may not be adequate for super fast transfer rates, e.g., 40 gigahertz or greater. Thus, embodiments of the invention apply hybrid microwave and high-speed processing technology to provide programmable and adaptable apparatuses for testing integrity of fiber optic network components. The high-speed processing technology could be digital, analog, optical, or any other means for rapidly computing trigonometric and other computation intensive functions.

Figure 2:
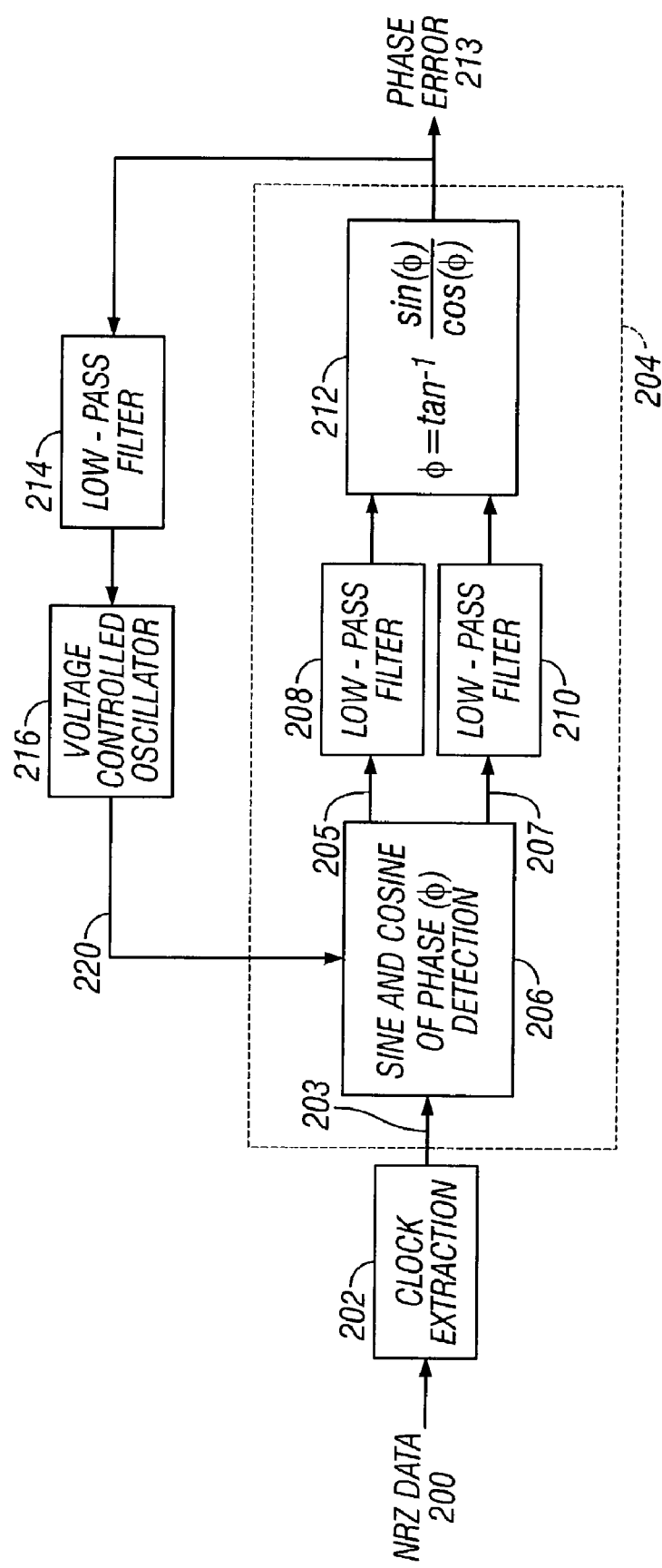
FIG. 2 is a block diagram overview of a clock recovery method in accordance with an embodiment of the invention.

FIG. 2 is a block diagram overview of a clock recovery method in accordance with an embodiment of the invention. It comprises the clock extraction block 202, the phase detection block 204, the filter block 214, and the voltage controlled oscillator block 216. The input bitstream NRZ data 200 is fed into block 202 for extraction of the clock signal. As discussed earlier, an incoming NRZ data does not contain the clock signal. However, because data transitions occur at the clock frequency, various methods are available for extracting the clock from the NRZ data. For example, clock extraction methods include wideband doublers and Exclusive-OR gates. Since the clock signal is not present in the NRZ data, there usually are several periods of missing data transition edges thereby resulting in periodic loss of the clock signal extracted in block 202. Various methods of clock extraction are discussed later in this specification.

The extracted clock from block 202 is fed into the phase detector block 204, which also has the output of voltage controlled oscillator (VCO) 216 as input. Output 220 of VCO 216 becomes the recovered clock signal once the phase is locked between the incoming (e.g., extracted) clock 203 and the generated/recovered clock 220. The recovered clock may then be used to recover the data and perform other integrity testing functions. Note that for RZ data, clock 203 is present in the data stream therefore the additional step of extracting the clock may not be required and the input data stream may be fed directly into the phase detector.

The phase detector block 204 comprises: the Sine and Cosine of Phase Detection block 206; low-pass filter blocks 208 and 210; and phase computation block 212. At block 206, an embodiment of the invention generates the sine, 205, and cosine, 207, of the phase angle from the difference between the extracted clock (from block 202) and the generated clock (output of the VCO). The sine and cosine of phase detection block may be implemented with devices such as I/Q mixers and high speed samplers. In embodiments using high speed samplers, the high speed sampler may be triggered by the clock extractor, for example. Note that in one or more embodiments, block 206 uses the recovered clock (output of VCO 216), a 90 degree phase shifted variant of the recovered clock, and the extracted clock to generate the sine and cosine of phase angle error between the extracted clock and the recovered clock.

The sine and cosine of the phase angle are then filtered, if necessary, in blocks 208 and 210 before being fed to block 212 for computation of the phase angle error 213. Filtering in blocks 208 and 210 may be necessary, for example, to provide analog memory for periods when there is no extracted clock data (i.e., no data transitions in NRZ format data) thus still allowing computation of the phase error out of the sine and cosine of the phase error in block 212. The filters also serve to smooth (i.e., generate the average) the pulsed waveform outputs of block 206 into analog signals with characteristics frequency within the pass band of filters 208 and 210. In embodiments where the computation of the arctangent is done in the digital domain, the filters may also act as anti-aliasing filters. Aliasing is a sampling phenomenon whereby resonant frequencies occurring above fifty percent of the sampling frequency appear as aliases of themselves. Thus, the function of an anti-aliasing filter is to reduce the possibility of picking up aliases of resonant frequencies occurring as a result of sampling.

In embodiments in which the phase estimation process is done entirely in the analog domain, the arctangent may be approximated for small angles by the tangent obtained from the analog division of the sine and the cosine signals. Such analog division can be implemented by placing a multiplier in the feedback path of an analog multiplier device. A completely analog embodiment will afford the feedback signal to lock the VCO to the underlying clock of the data pattern using a PLL scheme. But, depending on the level of approximation, a completely analog embodiment may not allow for a real track on the phase differences between the underlying clock signal and the VCO which is required for jitter measurement.

The generated phase error, 213, is then fed into filter block 214 to stabilize the phase locked loop (notice that the circuit is essentially a PLL). Output of the filter (e.g., 214) is the tuning voltage input to the VCO, 216. The VCO then adjusts its output frequency accordingly until phase error 213 is essentially zero thereby producing the correct input clock frequency at 220. In this embodiment, the output of the VCO (i.e., 220) is the recovered clock. An embodiment of the invention uses the sine and cosine of the phase error to generate the phase angle and since the sine and cosine outputs droop together in the absence of bit changes, the quotient of the sine and the cosine computed in block 212 is preserved. In prior art systems, the phase error fades to zero (i.e., is lost) when the extracted clock is lost because of missing transitions common in NRZ data.

Figure 3:
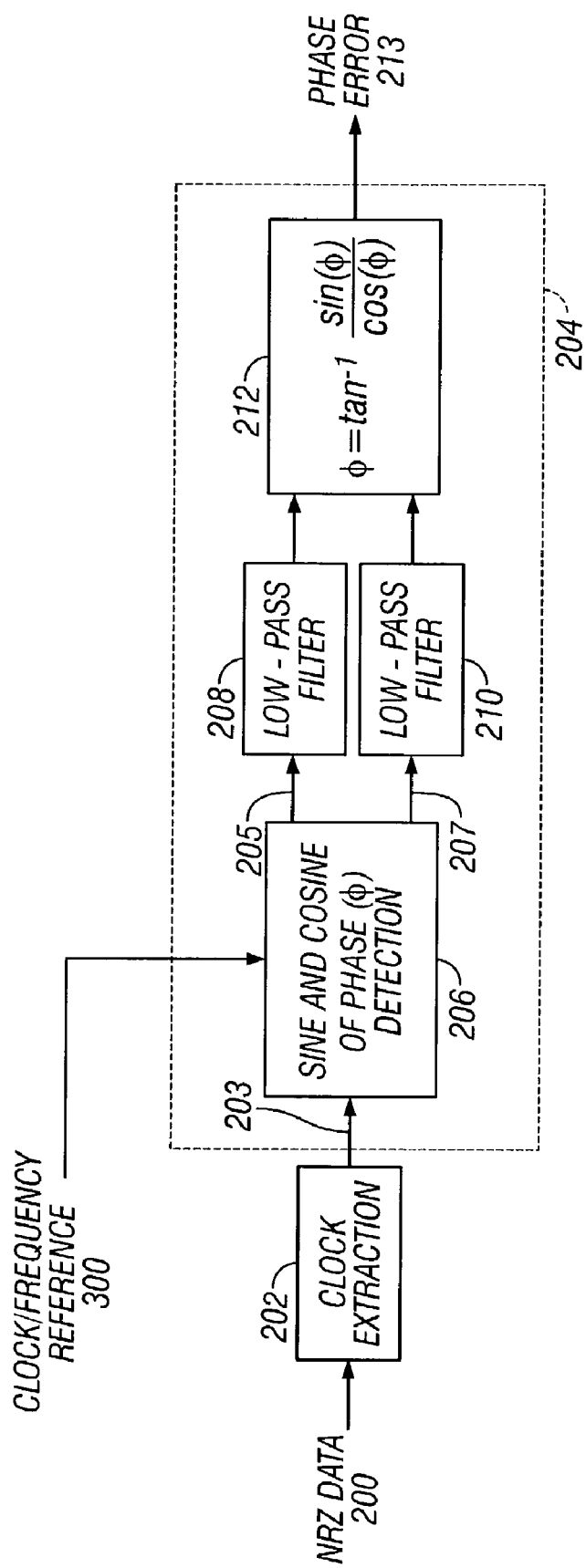
FIG. 3 is a block diagram overview of a jitter measurement method for SONET (Synchronous Optical Network) applications in accordance with an embodiment of the invention.

FIG. 3 is a block diagram overview of a jitter measurement method for SONET (Synchronous Optical Network) applications in accordance with an embodiment of the invention. It comprises clock extraction block 202 and phase detection block 204 of FIG. 2. The difference between the schematics of FIG. 2 and FIG. 3 is that a precision and super-stable clock/frequency reference 300 is used instead of the generated clock of FIG. 2 for phase error calculation. Thus, a phase locked loop is not used in this embodiment. However, it would be apparent to those of skill in the art that the same phase locked loop discussed with respect to clock extraction above can be used for jitter measurement.

The super-stable precision clock/frequency reference 300 is measured against the extracted clock 203 from the input data stream to generate a sine of phase error, 205, and a cosine of phase error, 207. Note that in one or more embodiments, block 206 uses the super-stable clock/frequency reference, a 90 degree phase shifted variant of the super-stable clock/frequency reference, and the extracted clock to generate the sine and cosine of phase angle error between the extracted clock and the super-stable clock frequency reference. The sine and cosine of phase error are subsequently filtered in low-pass filter blocks 208 and 210. Filtering may be required, for example, if frequency content of jitter is desired in embodiments where the computation of the arctangent, block 212, is performed in a digital processing unit. Phase error 213 is a measure of jitter of the input data stream with respect to the super-stable clock/frequency reference.

Figure 5:
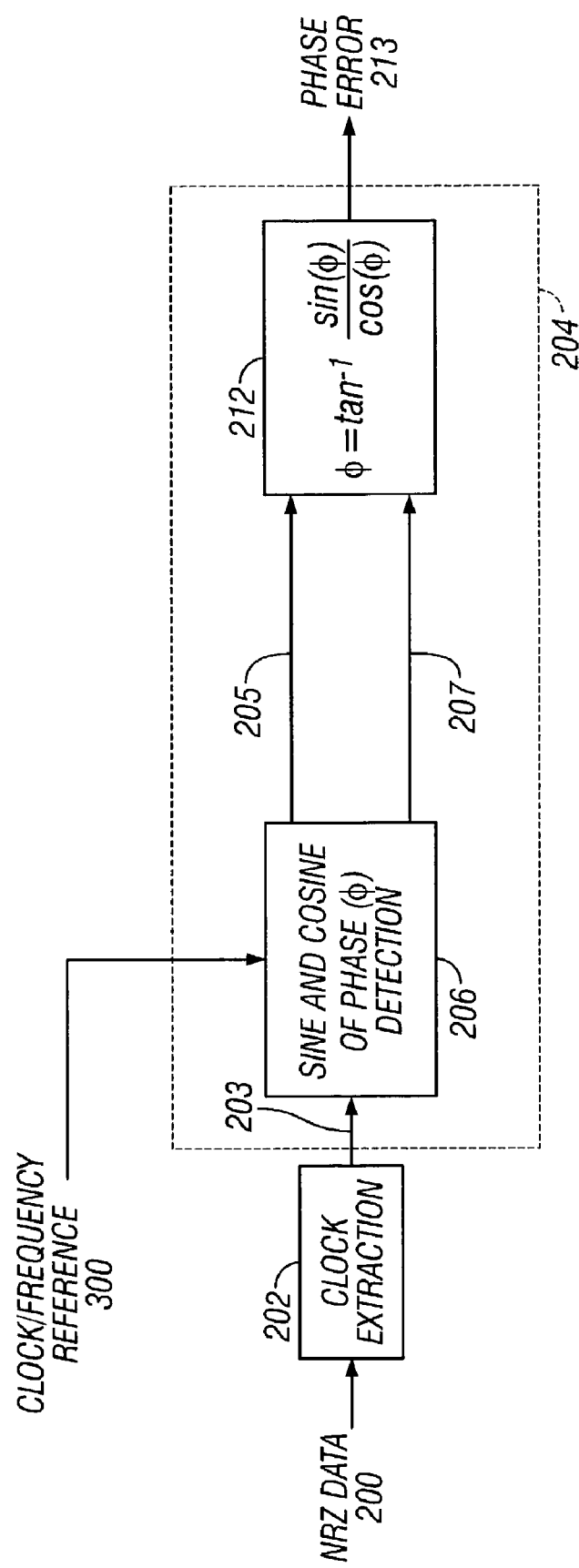
FIG. 5 is a block diagram overview of a jitter measurement method for Ethernet applications in accordance with an embodiment of the invention.

In other embodiments where frequency content is of no paramount importance, such as Ethernet applications, the apparatus for jitter measurement may not require low-pass filters 208 and 210. This configuration is illustrated in FIG. 5.

Jitter measurement requires the computation of the phase vector. The phase vector is a continuous phase signal (i.e., unwrapped) because most jitter specifications require measurements of when the phase error passes certain thresholds. Thus, the phase vector must be unwrapped (i.e., allowed to go beyond 360 degrees) and the input clock preferably compared against a super-stable clock/frequency reference source.

A super-stable clock/frequency reference source is a device that preferably produces sinusoidal signals at or close to the highest data rate. The signal should be capable of being tuned to a desired frequency. For instance, some super-stable clock/frequency reference devices are Phase Locked Loops (PLLs) that include internal or external low frequency oscillator references with which the final clock/frequency reference is tuned. The low frequency reference basically determines the phase noise profile within the bandwidth of the corresponding phase locked loop. The oscillator used in the super-stable clock/frequency reference device may include devices such as: Transistor Dielectric Resonator Oscillator (TDRO), YIG Tuned Oscillator (YTO), and Voltage Controlled Oscillator (VCO).

Transistor Dielectric Resonator Oscillators are dielectric cavity resonators that have enhanced temperature stability because of the use of ceramic materials. Thus, achieving high quality (Q) resonant networks are very likely with TDROs. TDRO devices require a Low Frequency Reference Oscillator. A TDRO system provides excellent phase noise profiles for frequency offsets outside its loop bandwidth. However, the ability to tune to a desired frequency is usually not as generous as with YIG systems, but TDROs are highly insensitive to microphonic perturbations.

A YIG Tuned Oscillator (YTO) is a device in which a change on a DC magnetic field modifies the resonant frequency of a single ferrite crystal YIG (Yttrium-Iron-Garnet) sphere with high quality (Q) characteristics. The YIG sphere is used to control the inductance of a coil inside an oscillator. YIG devices exhibit phase noise profiles comparable to TDROs. Although YIG devices are tunable over multi-octave microwave frequencies, they require very good microphonic isolation. However, YIG devices do not require external Low Frequency Reference Oscillators.

There are numerous types of implementations of Voltage Controlled Oscillator (VCO). Some implementations use a YIG oscillator that will be Phase locked to a Low Frequency Oscillator Reference. In all cases, suitable clock/frequency reference devices should have good (e.g., low) phase noise profile.

Phase noise profile accounts for the spectrum density of phase contributions with respect to the carrier frequency. The RMS phase variation contribution from a corresponding offset range may be obtained by integration over specific offset intervals. Different Clock/Frequency References can be compared by their phase-noise performance. All clock/frequency references will have a phase noise profile for frequency offsets within the loop bandwidth that depends basically on the phase characteristics of the Low Frequency Oscillator Reference.

Phase noise diagrams provide the elements to evaluate if a certain Clock/frequency Reference is appropriate for the considered application. In the case of Jitter/Wander measurements for SONET and Ethernet systems, the diverse specification requirements establish precision and range of measurement for phase peak-to-peak contributions at various offset intervals. These requirements also establish the type of filters, if any, used in measuring the phase peak-to-peak contributions. The properties (e.g., roll-off) of an appropriate filter allows development of a trapezoidal mask with which the RMS contributions of the Clock/Frequency Reference can be computed. Using the time elapsed during the phase measurements, the corresponding peak-to-peak contributions can be estimated out of RMS values assuming a Gaussian distribution for the phase variations. These peak-peak values should compare to the precision required for the test equipment for contributions in the corresponding intervals.

The characteristics of a Low Frequency Reference Oscillator is usually evaluated by its phase noise profile, the aging effect (usually in parts per million frequency offset over time), temperature stability (usually in parts per million frequency offset for a range of operating temperatures), and acceleration sensitivity (usually in parts per million over gravity acceleration). There are several commercially available Low Frequency Reference Oscillators, each offering different performance characteristics. These include: Crystal Oscillators, Voltage Controlled Crystal Oscillators, Voltage Controlled SAW oscillators, Temperature Controlled Crystal Oscillators, and Oven Controlled Crystal Oscillators.

For wander measurement, the super-stable Clock/Frequency Reference 300 is replaced with an external clock source such as from a Global Positioning System (GPS). Thus, the difference between jitter and wander measurement is that for jitter, the reference clock is a super-stable clock source while wander requires any external clock source.

Clock and Data Recovery

Figure 4:
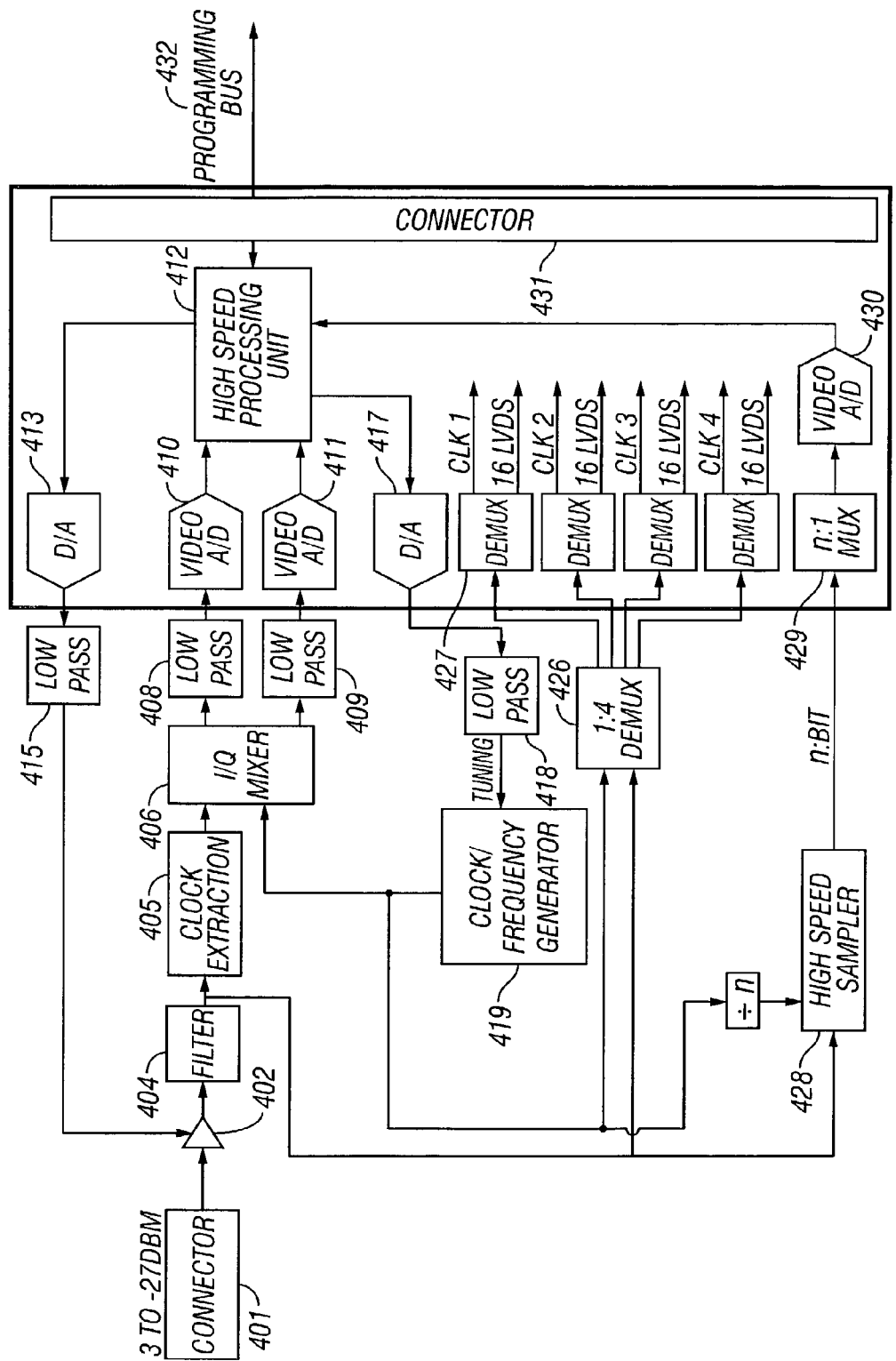
FIG. 4 is a block diagram illustration of a clock and data recovery method from a high speed NRZ signal in accordance with an embodiment of the invention.

One embodiment of clock recovery locks the reference oscillator (e.g., a VCO) to the input signal so that if the incoming data has a clock, the reference oscillator is exactly centered within one bit of the incoming clock stream. Once the clock is locked, the data can be accurately recovered. FIG. 4 is a block diagram illustration of a clock and data recovery method from a high speed NRZ signal in accordance with an embodiment of the invention. Connector 401 receives high-speed input bitstream with power ranging from 3 to −27 dbm, for example. The input bitstream may be NRZ data in the 40 gigabits per second range. Note that, although the input bitstream in this embodiment is NRZ data, other embodiments may be configured to accept RZ data. As discussed earlier, NRZ data does not contain the clock signal. However, since the data transitions occur at the clock frequency, the clock could be extracted from the bitstream.

The input data from connector 401 is subsequently fed into amplifier 402, which may be a variable gain amplifier or a limiting amplifier, for example. In one embodiment, the gain of the amplifier is automatically controlled by control logic in high speed processing unit 412 via a path through digital-to-analog converter (D/A) 413, and low-pass filter 415 to amplifier 402. The type and performance of D/A converter 413 depends on the frequency of the input signal through the amplifier. For example, D/A 413 could be an 8-bit high speed digital to analog converter when used for a 40 gigahertz input data.

High speed processing unit 412 may be used to set the maximum power level of amplifier 402 by adjusting the gain. Also, by controlling the power from the high speed processing unit, the invention can easily adapt to RZ data recovery because the power levels between NRZ and RZ may be different. With the high-speed processing unit controlling the gain of amplifier 402, the gain could be altered when the input data stream is switched between NRZ and RZ, for example. Also note that, although an amplifier is included in this embodiment, it would be apparent to one of skill in the art that the amplifier may be skipped entirely.

Output of amplifier 402 is fed into filter 404. Filter 404 may be a Bessel or a Gaussian filter, which is typical in communication systems. In general, the choice of filter should not compromise phase response for amplitude response especially since the data being sampled is at extremely high frequencies, e.g., 40 gigahertz. Most filters characterized by flat amplitude response may have large phase shifts resulting in the signal suffering distortion of its waveform in the passband. In fiber optics data transmission, the shape of the waveform is paramount therefore necessitating a linear phase filter (or constant time delay filter). The Bessel filter (also called the Thomson filter) has maximally flat time delay within its passband. Other filter types may be used so long as they do not distort the waveform. Also, some embodiments may not use a filter. However, if it is necessary to cleanup the input signal, then a filter with minimal waveform distortion at the passband is desirable.

In embodiments where the input data stream is at 40 gigabits per second, an appropriate filter bandwidth maybe at 30 gigahertz, for example. This is because, with NRZ data, the input data rate is actually 20 gigahertz. That is, the data appears to be at half the clock rate because a bit is high for an entire clock period and then low for an entire clock period making a 40 gigabit per second bit stream appear more like a 20 gigahertz signal. Therefore, a Bessel filter at 30 gigahertz may be adequate to knock out any ringing that is close to the 40 gigahertz of the input data stream while preserving the wave shape.

Next, if the input data stream is NRZ, then the data from filter block 404 is fed into clock extraction block 405 so that the underlying clock of the input data stream may be extracted. However, if the input data stream is RZ then the clock extraction step may not necessary since RZ data contains the clock. Also, various clock extraction methods may be employed thus present invention is not limited to those methods described herein. The clock extractor also acts as a frequency doubler because, as discussed earlier, the transitions for NRZ data occur at half the data frequency. Some examples of clock extraction methods are described later in this specification. The data stream for an RZ input or the extracted clock for NRZ input is fed into mixer block 406 for further processing.

Mixer 406 may be a standard quadrature mixer. For example, mixer 406 may be a silicon die I/Q mixer. The quadrature outputs (I/Q) of mixer 406, where I represents the sine and Q represents the cosine of the phase angle error, are filtered in filters 408 and 409. The mixer compares the generated (i.e., recovered clock), which is essentially the output of Clock/Frequency Generator block 419 with the input clock (e.g., output of clock extractor 405). Mixer 406 accepts the input clock and the generated clock as its inputs and produces the sine and cosine of the phase error as its quadrature outputs. A standard I/Q mixer uses two input clock signals and obtains a third clock signal by shifting phase of the second clock signal by ninety degrees. The I/Q mixer then generates a first intermediate frequency, called I or sine, through a first mixer using the first and second clock signals. The I/Q mixer generates a second intermediate frequency, called Q or cosine, through a second mixer using the first and third clock signals. Since the phase vectors of the second and third clocks are separated in phase by ninety degrees, the resulting intermediate frequency signals are said to be in quadrature. Thus the complete I/Q mixer is also known in the arts as a quadrature mixer.

Phase shifting of the generated clock signal in the quadrature mixer may be accomplished using any device that can produce the appropriate amount of delay. For instance, phase shifting of ninety degrees may be accomplished by a simple time delay of 12.5 picoseconds when the second clock signal is a 40 GHz clock signal.

The generated clock may be the output of a precision Dielectric Resonant Oscillator device, for example, with tuning voltage "TUNING V" as input. The frequency of the output of the recovered clock may be further divided using clock dividers in order to produce clocks needed for demultiplexers, for example, DEMUX 426. An implementation such as this provides the required system clock and any additional clocks such as, for example, 10 and 20 gigahertz for other functions in a test apparatus. For example, these additional clocks may be used for dividing the input data for processing in demultiplexer 426 or high speed sampler 428.

When clock extractor 405 acts on NRZ data it may produce a clock output with several missing pulses. This is because of the potential lack of bit changes over some sections of the NRZ bit stream. For instance, since the clock is generated from data transitions and since there may be long periods of no data transition ("1" to "0" or "0" to "1"), the extracted clock may appear for a while and then disappear and then it comes back and it disappears and may actually disappear for quite a long time. Therefore, there is a high probability that several clock pulses could be missing. For instance, it is possible to be missing up to 5,000 pulses in some cases.

When clock pulses are missing, the quadrature outputs of mixer 406 droop. But the key part of the invention is that the sine and cosine outputs droop together so that the quotient of the sine and the cosine is preserved. The sine and cosine output of the mixers are passed through low-pass filters 408 and 409. The low-pass filters act to hold the last value of phase when there's an absence of clock signals in the input. However, the filters may hold their last values only for a finite period of time thus the sine and cosine outputs of the filters decay with time. Since the filters hold their last value for sometime, there is some memory which is like an analog memory of what the last phase angle was.

The bandwidth and type of low-pass filters 408 and 409 may be chosen appropriately based on the desired output. For instance, in embodiments that utilize the same loop structure for clock recovery and jitter measurement, if measuring jitter up to 80 Megahertz is desired, then an 80 MHz filter may be used. Using an 80 MHz filter allows only the transmission of phase variations with frequency spectral components within the filter bandwidth. The filter bandwidth is important in a test environment where jitter is to be presented as a frequency response. For instance, it may be necessary to present a spectrum of jitter versus frequency of jitter, i.e., Jitter amplitude versus frequency of Jitter. Moreover, these filters act as anti-aliasing filters. Thus, if the bandwidth of each filter is selected to be at 80 MHz, then processing unit 412 may sample (i.e. perform computations) adequately at 160 MHz or higher without picking up frequency aliases. Because, sampling at a frequency lower than 160 MHz may result in loop instability and excessive loop delay.

Output of low-pass filters 408 and 409 are passed into A/D 410 and 411 where they are quantized. The bandwidths of the A/D converters are chosen based on the desired system processing speed and accuracy. For example, an embodiment may utilize 14-bit A/D converters. The output of the A/D converters are two quantities (i.e., sine and cosine of phase) that are passed to high speed processing unit 412 where the quantities are used to determine the phase angle error. Any appropriate method of rapidly computing the phase angle error from a sine and a cosine signal may be employed. For example, an embodiment may utilize one or more table lookups to minimize the number of arithmetic operations. The phase angle error computation should occur at very high speeds to minimize any delay in the feedback loop. As already remarked, purely analogous implementations could provide the analog division of the sine and cosine signals as an approximation of the phase difference for small angles.

In one or more embodiments, low pass filters 408 and 409 are chosen to have 320 MHz pass-band. In this configuration, very high speed samplers (e.g., above 640 MHz) are used in processing unit 412. Providing effective 8-bit resolution in such high speed samplers afford enough resolution for providing accurate phase track to the precision levels required for Jitter/Wander measurements in SONET systems.

Figure 10:
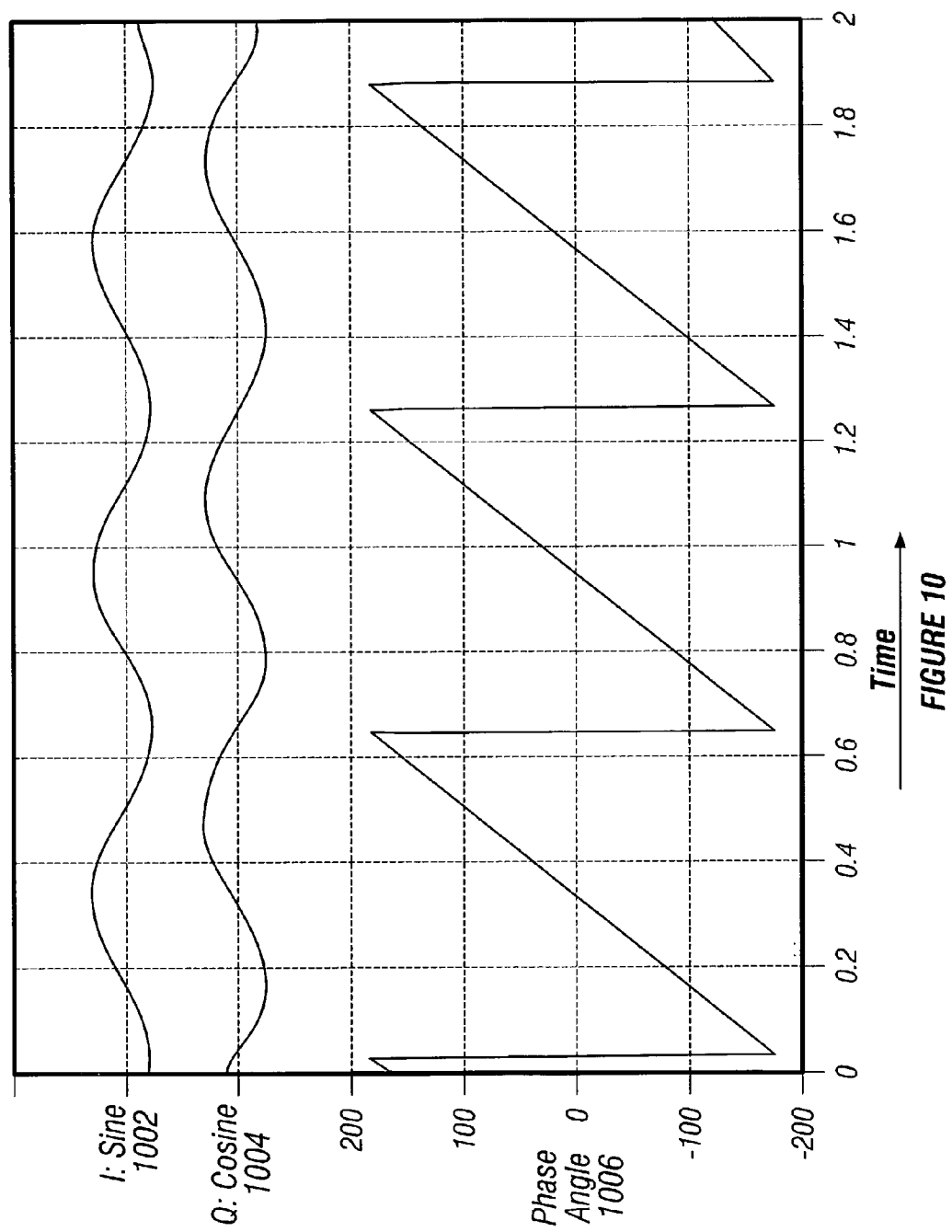
FIG. 10 is an illustration of the phase plot obtained when the frequency of the clock/frequency reference is offset with respect to a constant frequency of the input data stream.

The phase linearity afforded by the present invention is illustrated in FIG. 10. Prior art methods do not obtain this linearity for high rate NRZ signals in the 40 GHz and higher range. Embodiments of the invention obtain this type of linearity by taking advantage of the fact that the sine and cosine of phase error droop together so their ratio is preserved and also by being able to do high-speed computations of the phase angle error.

In one or more embodiments, phase of the output clock (i.e., generated clock) may be varied by adding a desired phase shift as a number to the phase angle error computed by high speed processing unit 412 through the programming bus (i.e., 432) attached to connector 431. This allows introduction of predetermined phase shifts on the recovered clock After the phase angle error is computed in high speed processing unit 412, it is then converted back to analog in D/A block 417, and filtered through low-pass filter 418 to produce a tuning voltage, TUNING V, for the clock/frequency generator (i.e., 419). Clock/Frequency generator 419 may be a type of high performance voltage controlled oscillator (VCO), for example. In the clock and data recovery mode of the invention, the output frequency of block 419 may be tuned by the voltage error (i.e., Tuning V). For precise clock tuning, which requires high resolution signal, D/A 417 may be a 16-bit converter, for example. Additionally, compensation circuits may be added to the computed phase angle in high speed processing unit 412 to further provide stability of the closed loop system. Such compensation may include lead-lag type filtering for stabilization. The bandwidth of low-pass filter 418 depends on the desired lock frequency. For instance, 10 MHz bandwidth may be desirable when locking to the input signal, where it is desired to stabilize the loop (i.e., PLL) above 4 MHz. Thus, the choice of bandwidth depends on the specification requirement for loop jitter.

After locking onto the input clock, output from the dynamically adjusted (i.e., feedback locked) Clock/frequency reference block 419 is passed as clock input to the demultiplexer 426, which accepts the filtered input data stream from filter block 404 for data extraction. Each of the four outputs of the demultiplexer is subsequently fed into demultiplexers 427 where they are demultiplexed with appropriate clock signals and made available to the user in the form of low voltage differential signals. Additionally, a high speed sampler 428, which may also be a high speed demultiplexer, may be added to break the incoming data into n-samples thus slowing down the clock rate of the individual samples down to manageable values. One implementation of a high speed sampler is described in U.S. Pat. No. 5,479,120, issued to Thomas McEwan, entitled: "High Speed Sampler and Demultiplexer."

High speed sampler 428 may be used to demultiplex the input data stream into thirty two samples thereby slowing down the input signal rate by thirty two times. Thus, a 40 gigabit per second data is slowed down to a manageable 40/32 gigabit per second sample. All thirty two outputs of high speed sampler 428 are fed into a 32:1 multiplexer 429. The manageable output of multiplexer 429 is converted into digital form by A/D converter 430 and then transmitted to high speed processing unit 412 for further processing. A/D converter 430 could be a 14-bit converter, for example.

Figure 18:
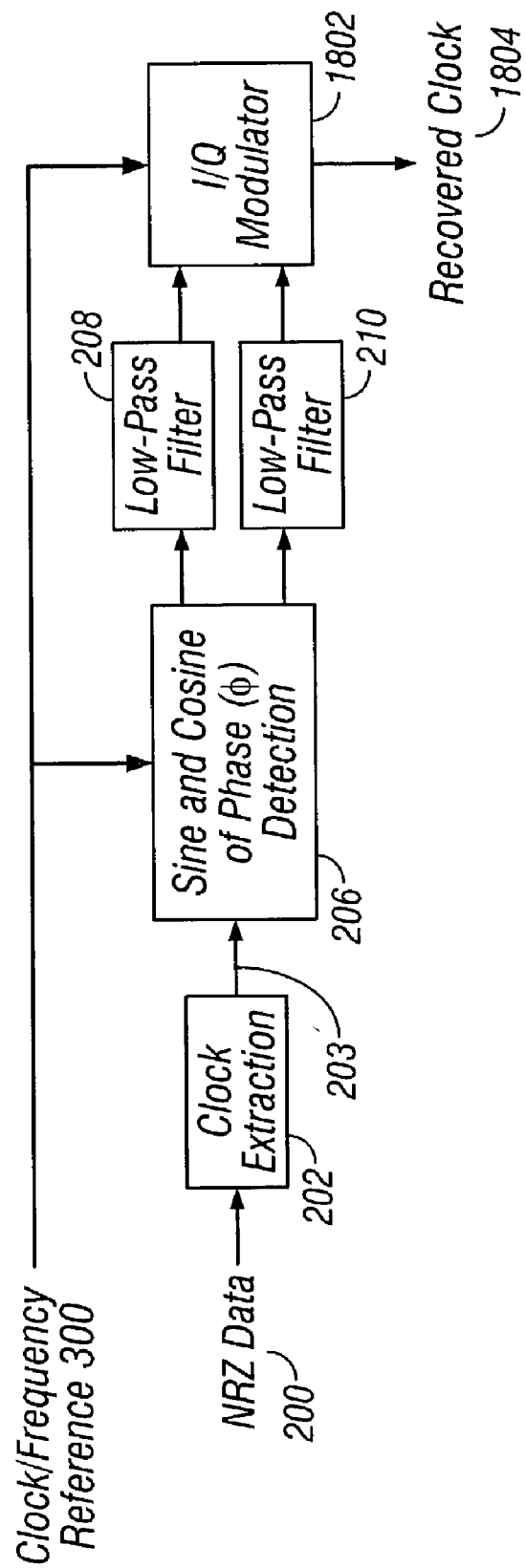
FIG. 18 is a block diagram illustration of a clock recovery method using a super-stable clock/frequency reference in accordance with an embodiment of the invention.

In one or more embodiments, clock recovery may be implemented with architecture that does not involve the tuning voltage and computation of the phase angle. FIG. 18 is a block diagram illustration of a clock recovery method using a super-stable clock/frequency reference in accordance with an embodiment of the invention. This illustration follows the description presented for the embodiment of FIG. 3 with some slight modifications. For instance, the low-pass filtered sine and cosine signals (outputs of blocks 208 and 210) may be used to modulate the sinusoidal signal of the super-stable clock/frequency reference 300 through an additional I/Q (or quadrature) modulator 1802 instead of being passed to a high speed computation unit for computation of phase angle (i.e., using the arctangent function). In this embodiment, I/Q Modulator 1802 generates a modulated output signal which corresponds to a recovered clock 1804 with very accurate tracking of the clock underlying the input data stream (e.g., NRZ data 200).

This clock recovery method illustrated in FIG. 18 may be used simultaneously with the jitter/wander measurement embodiment presented below. Splitting the sine and cosine signals makes the system adaptable to various embodiments of the invention.

In an embodiment, an I/Q mixer may be used in block 206 to generate the sine and cosine of phase angle error between the NRZ data 200 and the super-stable clock/frequency reference 300. Note that in embodiments where block 206 is implemented using an I/Q mixer, the quadrature mixer uses two inputs comprising the extracted clock and the super-stable clock/frequency reference, but also internally obtains a ninety degree phase shifted variant of the super-stable clock/frequency reference and uses all three signals to generate sine (i.e. I) and cosine (i.e. Q) of the phase angle error. The sine and cosine of phase angle may be filtered in blocks 208 and 210, if necessary, before being fed to I/Q modulator 1802, which also accepts clock/frequency reference 300 to generate the recovered clock, 1804. Thus I/Q modulator 1802 performs the reverse function of I/Q mixer 206 by adjusting the phase of the clock/frequency reference to track the clock underlying the incoming NRZ data 200.

The recovered clock, 1804, is the underlying clock of the incoming NRZ data 200 and thus can be used for data recovery.

Clock Extraction

The greatest spectral frequency components of an NRZ bit stream are typically in half of the bit rate frequency. For instance, a 40 Gigabits/second data stream has dominant frequency contributions of 20 GHz. Thus, in a 40 Gigabits/second bit stream, bit changes would occur at multiples of 25 picoseconds (1/40 GHz), if transmitting bit patterns of "1,0,1,0,1,0, . . . ", for example. This means that the clock is high for 25 picoseconds and low for 25 picoseconds so that one full clock cycle is 50 picoseconds.

Figure 8A:
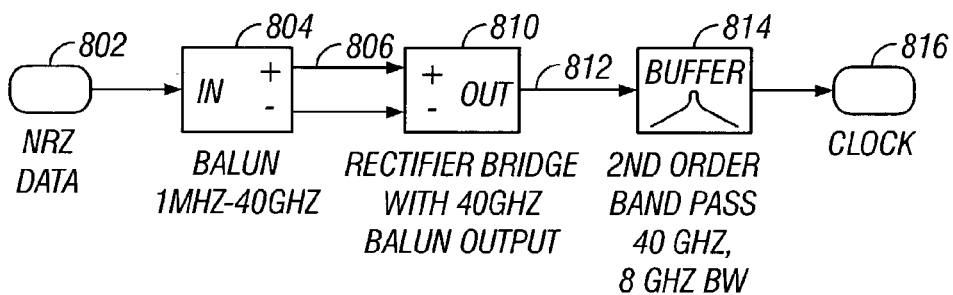
FIGS. 8A and 8B are schematics of a wideband doubler clock extraction method for NRZ data in accordance with an embodiment of the invention.
Figure 8B:
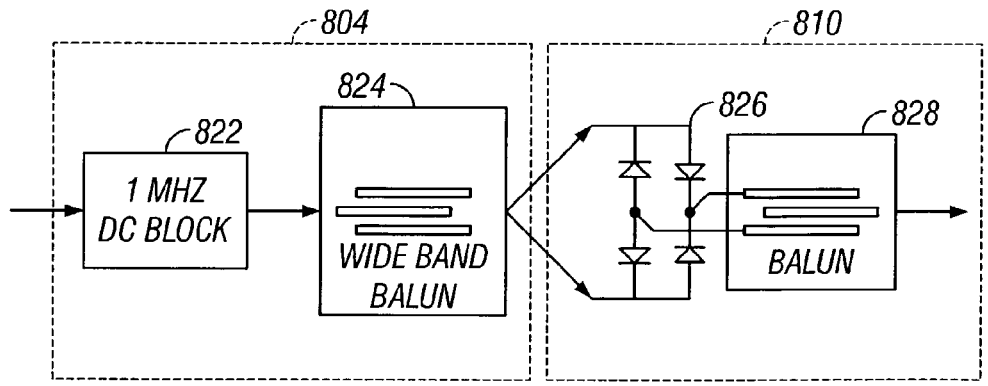

In one or more embodiments of the present invention, a frequency doubler is used for extracting the data clock. FIGS. 8A and 8B are schematics of a wideband doubler implementation of a clock extraction method for a 40 GHz NRZ data in accordance with an embodiment of the invention. FIG. 8A is a block diagram illustration of the wideband doubler method of clock extraction and FIG. 8B contains more detailed representation of some specific blocks of FIG. 8A. FIG. 8A will be discussed in conjunction with FIG. 9 which contains the transient responses at different pickoff points in FIG. 8A.

Referring to FIG. 8A, NRZ data at 40 gigahertz is input into connector 802. The transient response of the NRZ input data is shown as the "filtered input data" response in FIG. 9. Input data from connector 802 is fed into balun 804 which is a wide band balun. In general, a balun is a device that converts balanced signal to unbalanced signal or unbalanced signal to balanced signal. In one embodiment, balun 804 is a wide band 1 MHz to 40 GHz device which requires no delay. Balun 804 converts balanced to unbalanced and thus outputs differential signals: positive (i.e., 806) and negative (i.e., 808) signals that feed into Rectifier Bridge and Balun 810. The transient response outputs of balun 804 are shown as "Balun+" and "Balun−" in FIG. 9.

Figure 9:
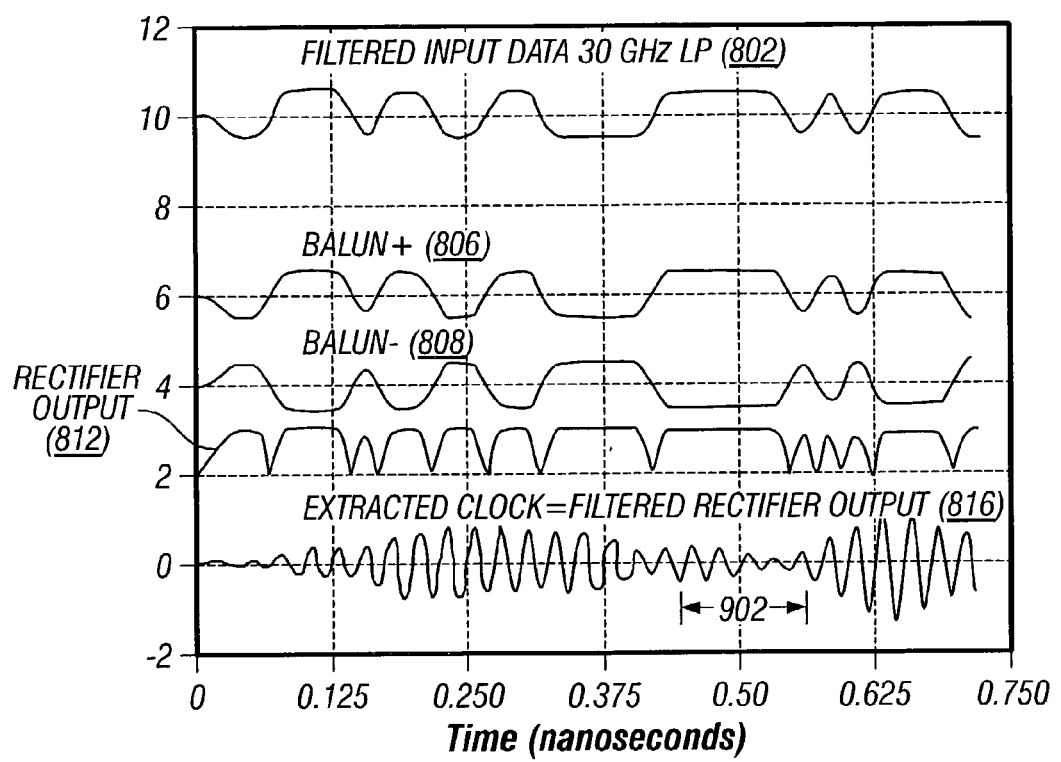
FIG. 9 is a graph showing the transient responses at intermediate output locations in a clock extraction scheme in accordance with an embodiment of the invention.

Output balun 810 produces a balanced 40 GHz rectified output. The rectifier basically generates the absolute value of the signal by converting the negative going pulses to positive. Output of balun 810 is shown in the transient response of FIG. 9 as "Rectified Output". The rectified output from balun 810 is further passed through bandpass filter 814. In one or more embodiments, bandpass filter 814 is a second order 40 GHz bandpass filter with 8 GHz bandwidth. In other embodiments, balun 810 may also provide the function of bandpass filter 814. The extracted clock output is made available at connector 816 and shown as "Extracted Clock" in FIG. 9. As shown in FIG. 9, the extracted clock is populated where there are numerous data transitions and starts to decay where data transition is sparse, for example, at region 902.

FIG. 8B is a more detailed representation of baluns 804 and 810 of FIG. 8A. Balun 804 is composed of the low frequency blocking circuit 822 and the wide band balun 824. The rectifier in Rectifier Bridge and Balun 810 is shown in FIG. 8B as block 826 which basically comprises a plurality of Schotty diodes. The "unbalanced to balanced" balun is shown as block 828.

Figure 7:
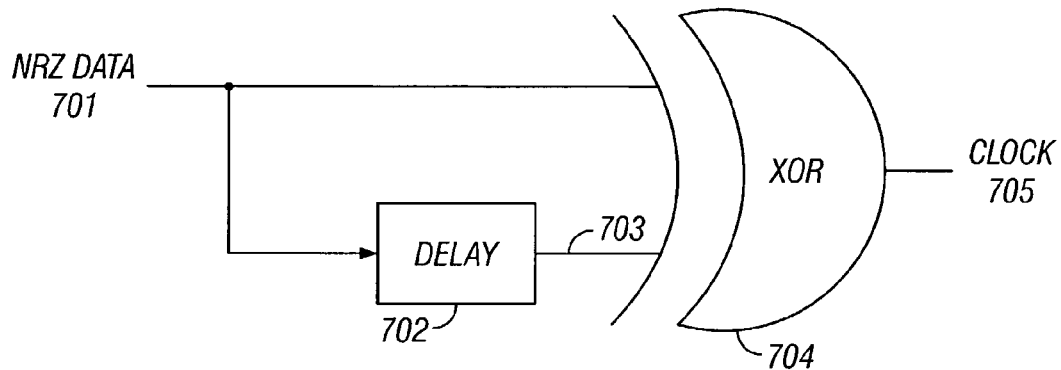
FIG. 7 is an illustration of using an exclusive OR for clock extraction in accordance with embodiments of the present invention.

Another method of extracting the clock of an NRZ data stream is to use an exclusive OR gate. FIG. 7 is an illustration of using an exclusive OR for clock extraction in accordance with embodiments of the present invention. In this illustration, NRZ data 701 is split into two branches: one branch is passed through delay block 702 to generate phase shifted output 703. The delay block shifts the phase of the incoming data by 180 degrees. Thus, for a 40 Gigabits/second data, an appropriate delay value should be 12.5 picoseconds when considering a 40 GHz clock.

The delayed signal output 703, of block 702, is passed as one of the inputs to a 2-input exclusive-OR gate (XOR 704) and the incoming data is passed as the second input to the 2-input exclusive-OR gate, XOR 704. The resulting output, clock 705, of XOR 704 has a frequency that is double the frequency of the incoming NRZ data. This result is illustrated graphically in FIG. 15.

Figure 15:
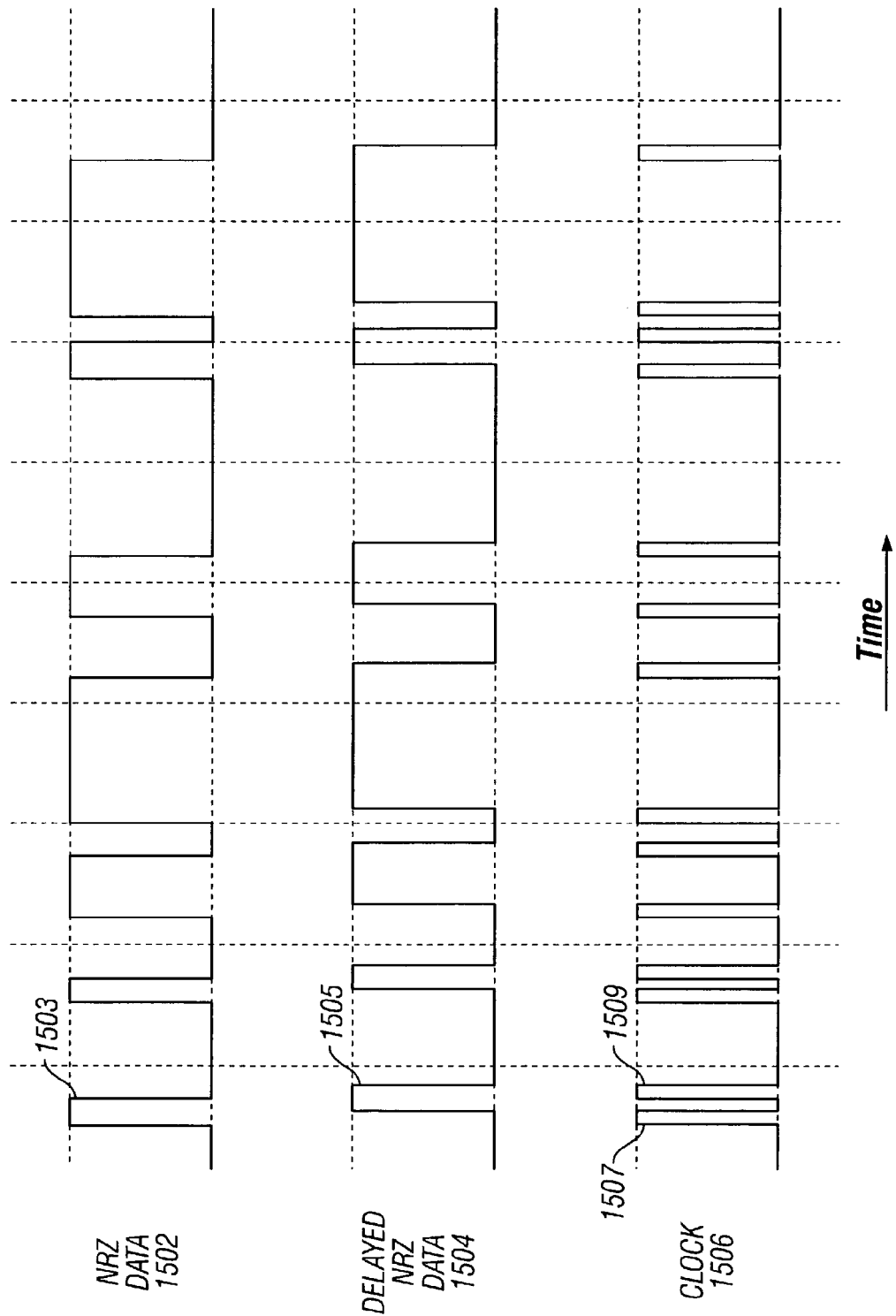
FIG. 15 is a graphical illustration of clock doubling using an exclusive OR gate in accordance with embodiments of the present invention.

Referring to FIG. 15, assuming waveform 1502 is the incoming NRZ data stream and that pulse 1503 is one bit time wide (e.g., 25 picoseconds for 40 Gigabits/second data). Waveform 1504 represents the delayed version of the incoming NRZ data 1502. Waveform 1504 is delayed by half the bit time thus pulse 1505 represents pulse 1503 shifted by one-half the bit time. Thus, for a 40 Gigabits/second NRZ data waveform 1504 is shifted by 12.5 picoseconds.

Waveform 1506 represents the output of a 2-input exclusive OR gate which has waveforms 1502 and 1504 as its two inputs. As shown, output 1506 of the exclusive-OR gate has a pulse starting at every bit change of the incoming NRZ data 1502. For example, the rising edge of pulse 1507 coincides with the rising edge of pulse 1503 where there is an occurrence of a bit change from low to high. Also, the rising edge of pulse 1509 coincides with the falling edge of pulse 1503 where there is an occurrence of a second bit change, i.e., from high to low. Thus, since the exclusive-OR output has a rising edge at every bit change of the original incoming NRZ data 1502, the output clock is essentially doubled.

High Speed Processing Unit (HSPU)

The high speed processing unit performs several computation intensive and control functions. For example, the HSPU computes or obtains the phase angle error from the sine and cosine of phase error. The computed phase angle may be maintained in memory for use in detecting and removing phase rollover (i.e., unwrapping the phase angle), for example. The unwrapped phase is referred to herein as the phase vector. Phase vector is important for jitter and wander measurements. The HSPU may also include compensation filters for loop stabilization and Eye-Diagram bandwidth control. It may also maintain logic for automatic amplifier gain adjustments (see FIG. 6) and provide user interface functions.

Jitter and Wander Measurement

Figure 12:
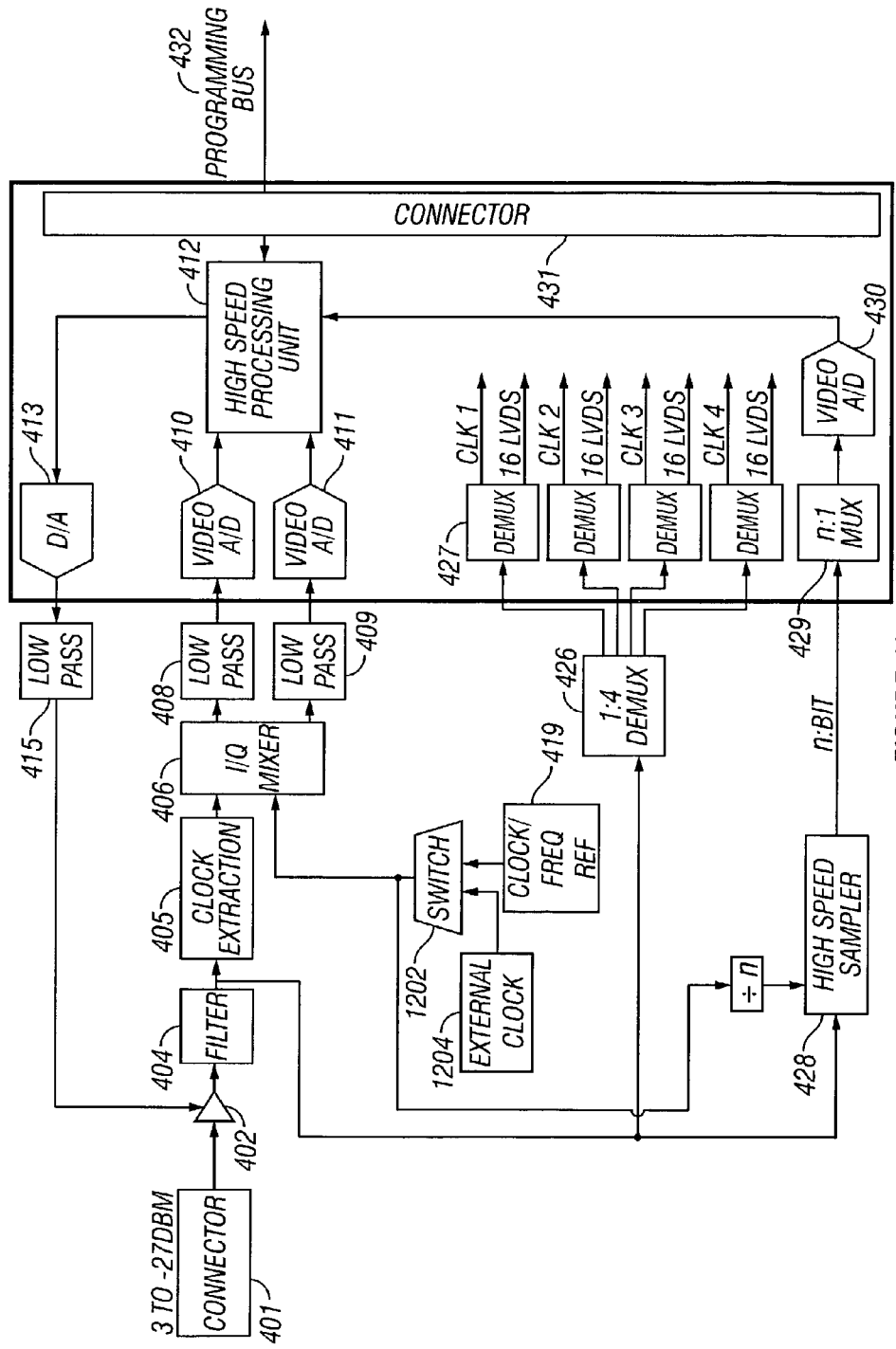
FIG. 12 is a block diagram illustration of a jitter measurement method on a high speed NRZ signal in accordance with an embodiment of the invention.

In one or more embodiments of the present invention, a precise and super-stable clock/frequency reference is used for jitter measurement in place of the generated clock. A super-stable clock/frequency reference is an oscillator producing a sinusoidal signal with extremely stable carrier frequency and with very low phase-noise profile for frequency offsets with respect to its carrier frequency. FIG. 12 is a block diagram illustration of a jitter measurement method on a high speed NRZ signal in accordance with an embodiment of the invention. As illustrated, this jitter measurement circuit is similar to that used for clock extraction in FIG. 4. However, for jitter measurement, the phase locked loop is not closed, i.e., D/A converter 417 and low-pass filter 418 are not used, instead a precision clock/frequency and super-stable reference source is used. The precision clock/frequency reference, 419, is capable of producing precise frequencies in and around the transmission data frequency range. Thus the frequency of the super-stable clock/frequency is tunable to a desired fixed value. In this illustration, a super-stable clock/frequency reference 419 or an external clock source 1204 is selected in switch 1202 depending on the application. Thus, for instance, while jitter may be measured against a super-stable clock 419, wander may be measured against an external clock 1204.

In one or more embodiments of the present invention, the super-stable clock/frequency reference is intentionally offset from the frequency of the incoming data stream. For instance, assuming an incoming data frequency of 40 GHz, the offset frequency may be set at any known delta value (e.g., ±2 MHz). The frequency offset results in the generation of an intermediate frequency (i.e., beat frequency). FIG. 10 is an illustration of the phase plot obtained when the frequency of the clock/frequency reference is offset with respect to a constant frequency of the input data stream. In this illustration, the horizontal axis is time. The waveforms I 1002 (Sine) and Q 1004 (Cosine) are outputs of an I/Q mixer implementation of the phase detection block (see block 206 of FIG. 3). The computed phase angle in degrees is plotted in waveform 1006.

As shown in FIG. 10, a constant slope exists in the phase plot (note that the phase angle jump from the 180 degree to the −180 degree represents the same point). The intentionally selected frequency offset of the clock/frequency reference from the input data bit rate serves multiple purposes including: providing an effective intermediate frequency that exhibits over time the full swing of both I (Sine of the phase angle) and Q (Cosine of the phase angle). Thus, an absolute reference of what a full 360 degree cycle is always available. This knowledge of the full phase cycle allows for automatic adjustment of any I and Q offset of the mixer with respect to zero, and the adjustment of the swing amplitude using a variable gain amplifier or attenuator in order to provide efficient use of the full scale of the Analog to Digital converters (see FIG. 6). The present invention is thus self calibrating at a rate equivalent to the constant frequency offset.

Referring back to FIG. 12, High-speed sampler 428 is clocked by the clock/frequency reference, 419, after its frequency is divided by a constant (e.g., 64). (Note that the divided clock may also be used to clock MUX 429 and be made available to HSPU 412). If the clock/frequency reference is exactly the frequency of the incoming data stream, each bit is sampled by the high-speed sampler at exactly the same position. However, if there is a small constant frequency difference between the clock/frequency reference and the underlying clock of the incoming data stream, then the sampler (i.e., 428) will advance slowly thus taking samples at multiple phase positions of the bit. The average number of multiple phase positions is approximately the quotient of the small constant frequency difference over the sampling rate.

For instance, assume an incoming data at 40,000 MHz (40 GHz) bit frequency and assuming an offset frequency of 2 MHz. Then with a clock divider of 64, for example, the high speed sampler is triggered by a clock 40,002/64 MHz. Thus, the sampler runs at a frequency of 625.03125 MHz. This means that the sampler advances 40,000/625.03125=63.9968002 Unit Intervals (UI) between each consecutive sample. Thus, the bit will be sampled 64−63.9968002=0.0031998=1/312.52 UI earlier than the previous sample. Therefore, surveying positions over a full bit, to reconstruct its profile requires approximately 312 samplings of the high speed sampler.

Thus, because embodiments of the present invention offset the clock/frequency reference a fixed amount from the incoming data frequency, Sampler 428 samples the profile of a bit of the incoming data stream in multiple positions. Referring back to FIG. 10, a full 0 to 360 degree sweep of a bit occurs in the period equivalent to the offset frequency. Thus, selection of the offset frequency of the clock/frequency reference depends on the desired number of sampling positions desired of each bit of the incoming data stream.

Eye-Pattern Testing

Figure 6:
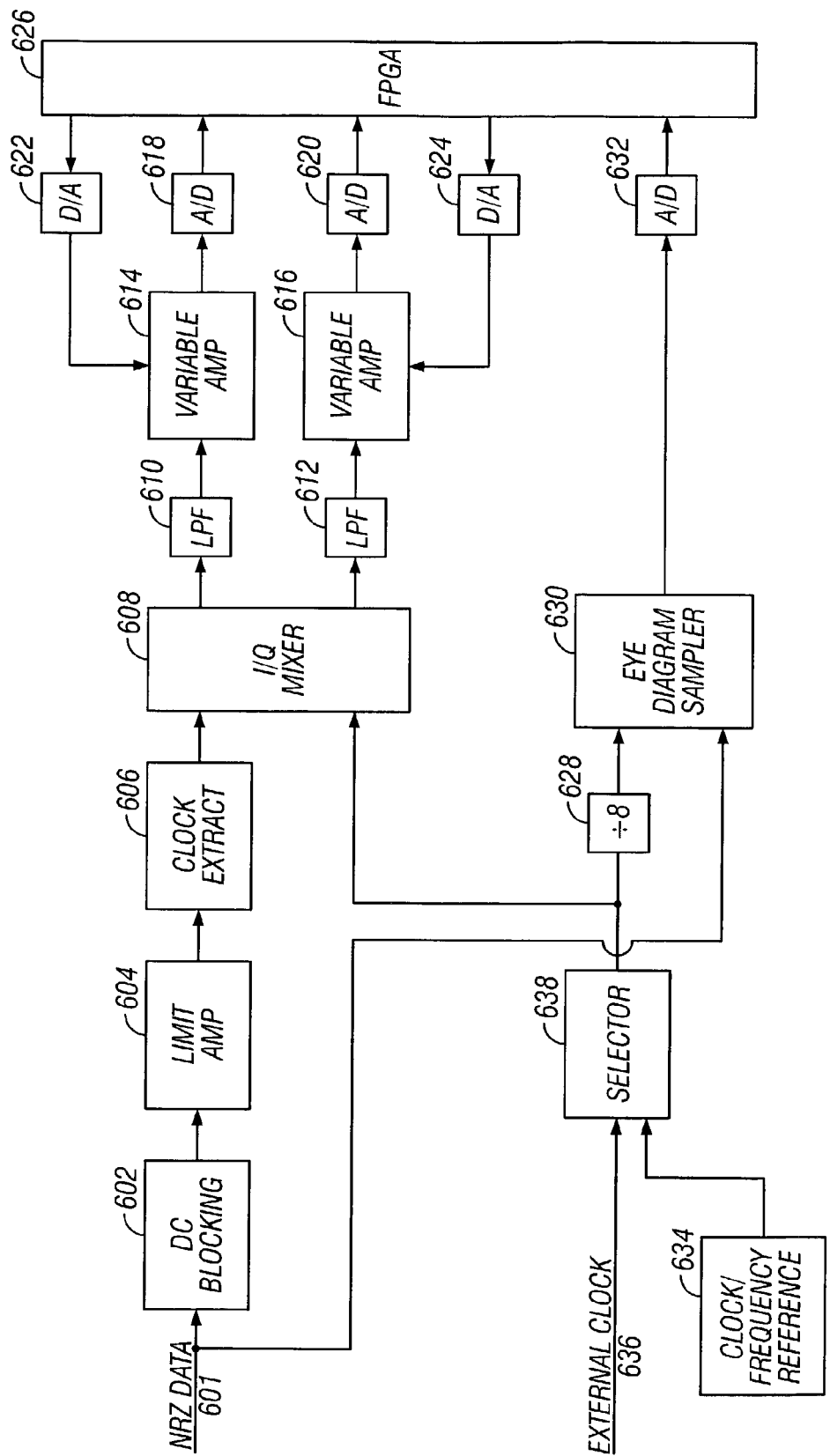
FIG. 6 is an illustration of jitter/wander measurement and generation of Eye-pattern for a 40 Gigabits/second input data stream in accordance with an embodiment of the present invention.

FIG. 6 is an illustration of jitter/wander measurement and generation of Eye-pattern for a 40 Gigabits/second input data stream in accordance with an embodiment of the present invention. As illustrated, a 40 Gigabits/second input data, 601, is passed through DC blocking device 602 and then to limiting amplifier 604. Output of limiting amplifier 604 is fed to clock extractor block 606, where the clock of the input data is extracted using one of the methods discussed in this specification. The extracted clock is fed as one input to I/Q mixer block 608. I/Q mixer 608 also accepts reference clock input from either an external clock source 636 or super-stable clock/frequency reference 634 through selector 638. I/Q mixer 608 generates the sine (I) and the cosine (Q) of the phase error between the incoming data and the reference. The sine and cosine outputs of I/Q mixer 608 are fed to low-pass filters 610 and 612. The bandwidths of these low-pass filters may be set to values adequate for the specific application. For instance, a bandwidth of 320 MHz is desirable for 40 gigabits/second data rate (e.g., OC768) SONET applications due to the specification requirements that span up to that frequency (see FIG. 13) and the filters may be removed entirely for Ethernet applications.

Figure 13:
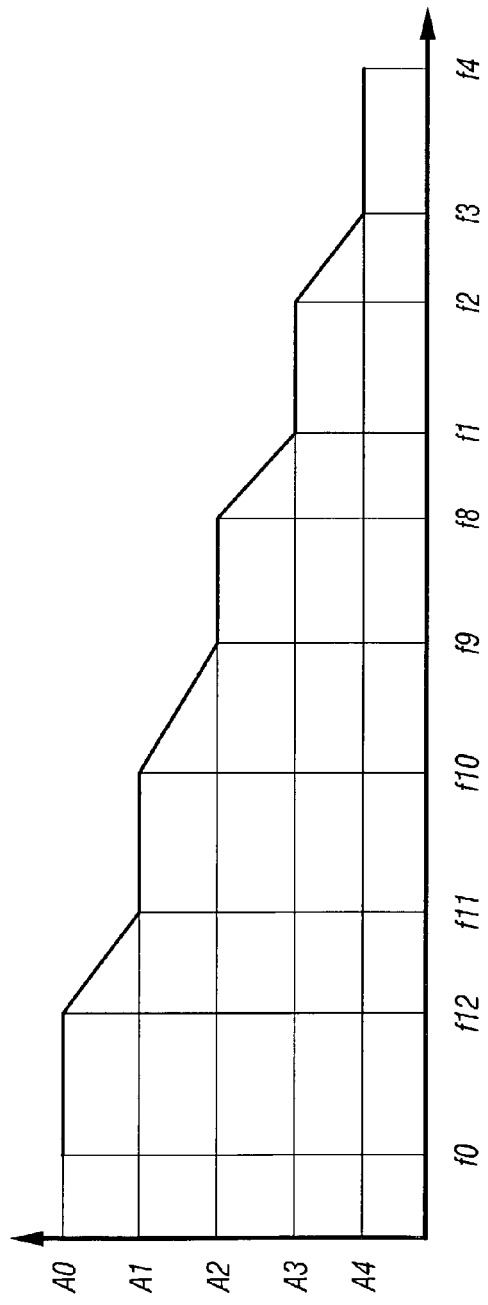
FIG. 13 is an illustration of a SONET requirement for minimum bandwidth of generated jitter versus frequency.

FIG. 13 is an illustration of a SONET requirement for minimum bandwidth of generated jitter versus frequency. As shown in FIG. 13, it is desirable to measure jitter up to 320 MHz (f4, a4) for OC768 SONET applications. Thus, the loop bandwidth of low-pass filters 610 and 612 should not be less than 320 MHz if it is desired to measure jitter and frequency for OC768 SONET applications.

The frequency of the clock/frequency reference may be intentionally offset from the input data bit rate in order to provide an effective intermediate frequency that exhibits over time the full swing of both I (Sine of the phase angle) and Q (Cosine of the phase angle). This intermediate frequency characteristic allows automatic adjustment of any I and Q offset with respect to zero, and the adjustment of the swing amplitude using variable gain amplifiers 614 and 616. By continuously adjusting the gain of the sine and cosine inputs, the full scale of Analog to Digital converters 618 and 620 are efficient utilized. In FPGA (Field Programmable Gate Array) block 626, phase angle is generated by computing a phase angle function that corresponds to arctangent function of adequately selected quotients of the sine and cosine signals. This phase angle function provides angles in the four quadrants in the range from −180 degrees to +180 degrees.

The following discussion is an illustration of a procedure for the computation of the phase angle function of block 626 in accordance with an embodiment of the present invention. In one or more embodiments, the two output signals from block 608 are proportional to quadrature samplings of the Clock/Frequency Reference. After filtering in blocks 610 and 612, the quadrature outputs arrive at blocks 614 and 616, which are high input load amplifiers with approximately identical gains, where they are rescaled. This rescaling allows efficient use of the measurement scale of Analog to Digital Converters 618 and 620 over the measurement time. The variable gain amplifiers may be controlled by logic in the FPGA through digital to analog converters (DAC) 622 and 624.

Now, the accuracy of the phase measurement relies on the assumption that in absence of bit changes (in the incoming data) the collected measurements decay slowly enough and both signals decay proportionally so that large distortions in phase are not created until the sine and cosine signals are updated through the next bit changes. Each update is efficient in the sense that the larger the required corrections, the higher the voltage difference that drives the update.

To provide trustful phase track, the length of the vector built by both quadrature signals should not go below certain level. Also, vectors that exceed certain length may be excluded since they might saturate the maximal reading of either one of the quadrature signals, which may lead to distorted phase measurements. Therefore, two concentric circles may be specified that limit the length of vectors (starting at the origin) associated with acceptable phase tracks. In one or more embodiments, a grid of possible bit assignments to both quadrature measurements allows implementation of a look-up table for assigning the phase measurement to the readings of the quadrature signals. Thus, a reading may be assigned or dismissed so that the update is omitted if the quadrature vectors are outside the limits associated with acceptable phase tracks.

Figure 16:
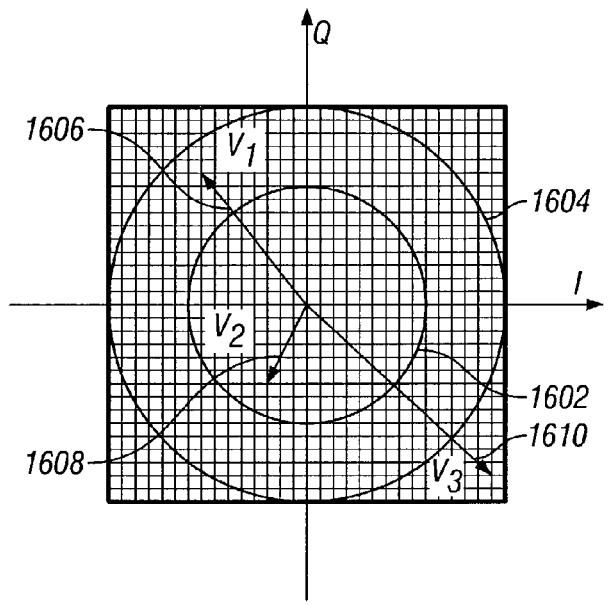
FIG. 16 is an illustration of the bit grid assignment method in accordance with an embodiment of the present invention.

FIG. 16 is an illustration of the bit grid assignment method in accordance with an embodiment of the present invention. In this illustration, circle 1602 provides the minimum and circle 1604 provides the maximum boundaries for acceptable phase track. Using the three examples of vector readings illustrated, V1 1606 would be an acceptable phase track, whereas V2 1608 and V3 1610, which are below or above the admissible vector lengths within the concentric circles, should be dismissed (i.e. no updates made to the computed phase angle) as unacceptable. A table lookup embodiment may automatically assign a predetermined phase angle to each pair (sine and cosine) of valid coordinates or skip an update when either of the data is not to be trusted. Thus, using a table lookup to compute the phase angle allows for elimination of signals that cannot be trusted for accuracy and provides for sparse real-time computation of the quotients and inverse trigonometric functions (arctangent). Therefore, embodiments of the present invention allow for computation of phase angle using table lookup. Note that other embodiments may simply compute the phase angle using the trigonometric arctangent function instead of the table lookup approach, or use a combination of both methods.

Figure 14:
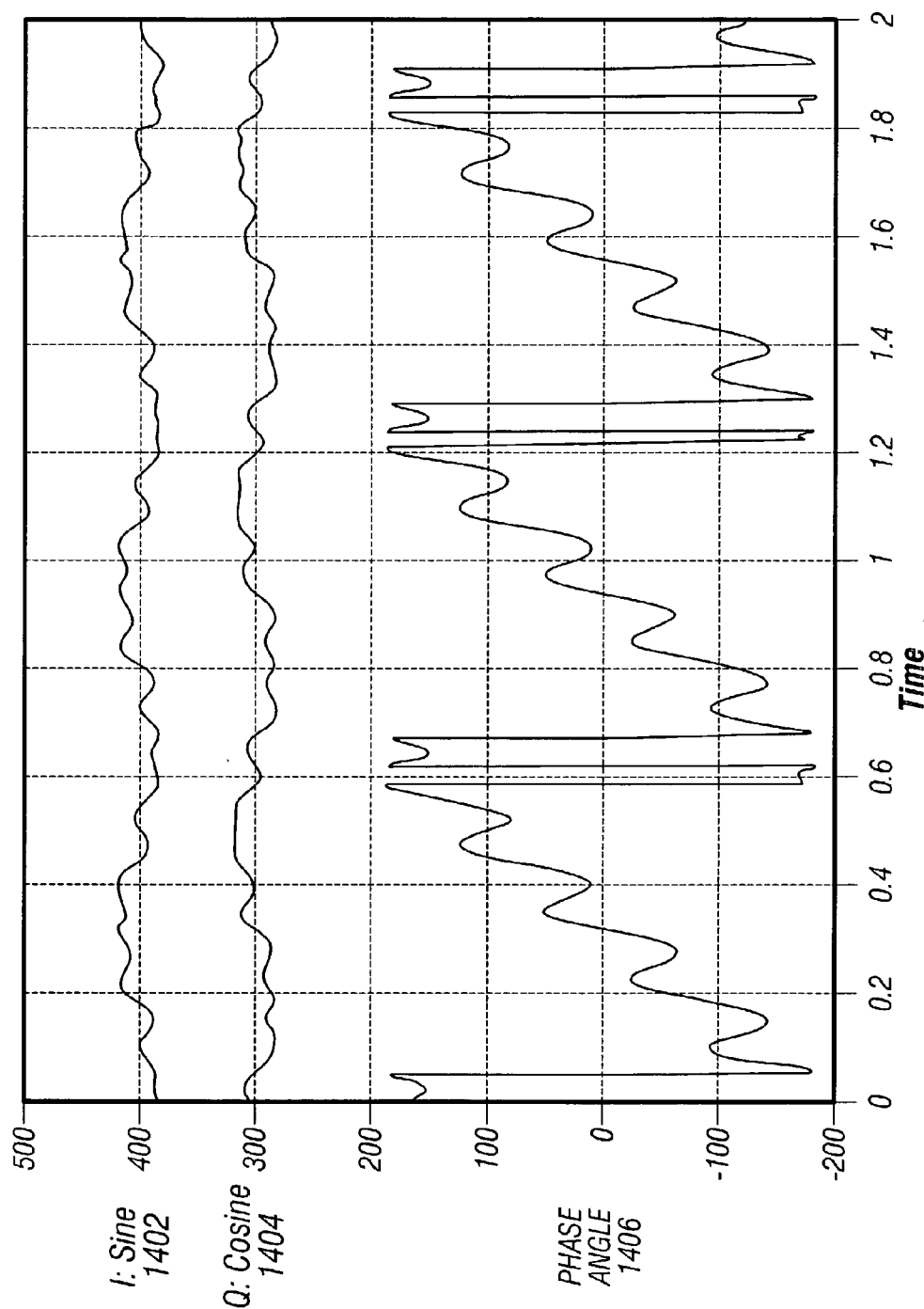
FIG. 14 is an illustration of the phase plot obtained for data with sinusoidal jitter.

FIG. 14 is an illustration of the phase plot obtained for data with sinusoidal jitter. As in the illustration of FIG. 10, the frequency of the clock/frequency reference is offset with respect to the constant frequency of the input data stream. In this illustration, the horizontal axis is time. The waveforms I 1402 (Sine) and Q 1404 (Cosine) are outputs of an I/Q mixer implementation of the phase detection block (see block 206 FIG. 3). The computed phase angle in degrees is plotted in waveform 1406. In this illustration, the manifestation of the sinusoidal jitter of the incoming data stream appears as a sinusoidal contribution to the accumulated phase angle over time. Thus, as shown in FIG. 14, the sinusoidal jitter of the incoming data stream appears superimposed over the phase error created by the frequency offset (see FIG. 10).

Referring back to FIG. 6, an illustration of methods for testing Eye-pattern of the incoming data stream is included. Embodiments of the present invention provide a known phase relationship between the incoming data and a fixed reference (i.e., super-stable clock/reference 634). Very high speed samplers may be triggered by output of a frequency division of the fixed clock/frequency reference to take samples of the voltage level of the incoming data. This allows for simultaneous sample of voltage level and track of phase angle error with respect to the underlying clock. These samples of voltage level and phase error provide data from which an "Eye-Diagram" can be constructed. Furthermore, the frequency offset between the clock/frequency reference and the data bit rate assures that manifold phase positions within a bit will be sampled over time.

As illustrated in FIG. 6, the incoming data 601 is fed to Eye Diagram Sampler 630. Also, frequency of the super-stable clock/frequency reference is divided in block 628 (e.g., divide by 8) and the divided clock is fed to the Eye Diagram Sampler 630. The voltage level output measured by the eye diagram sampler is fed to A/D block 632 for conversion to digital after which the digital signal is fed to FPGA 626. Thus, at FPGA 626, the voltage and phase of the incoming data stream are known and can be used for construction of an Eye Diagram (i.e., Eye pattern graph).

The tracking of the phase with respect a super-stable clock/frequency reference has multiple advantages over prior art systems for producing an "Eye Diagram". For instance, the snapshots of the incoming data signal using a sampler can be synchronized to the phase tracking in such a way that the voltage level of the incoming data signal as well as its phase within the bit is obtained at the moment of sampling. Due to the frequency offset, samples are collected at diverse phase positions within a bit. It is therefore possible to construct the "Eye Diagram" which gives the values of the voltage of the incoming signal at diverse positions with respect to the underlying clock.

Additionally, the present invention resolves prior art issues with limited bandwidths associated with phase locked loops in clock recovery circuits of oscilloscopes. The present invention has no such bandwidth limitation and does not require recovering the underlying clock of the incoming data. With a high bandwidth, the present invention minimizes the delay at which frequency variations are updated and allows for accurate measure of jitter and clock. Imposition of a narrow bandwidth is user controllable. Any desired system bandwidth may be imposed by a user simply adding a low-pass filter (digitally) with the desired bandwidth to the generated phase angle in FPGA 626. Since the desired bandwidth is user controllable, the present invention affords flexibility which is not available in prior art systems. Of course, the overall system bandwidth may be limited by the bandwidth of low-pass filters 610 and 612.

The limited loop bandwidth used in prior art clock recovery systems creates inherent delay in the track of the underlying clock data. This delay accentuates the effect of certain jitter components on the Eye Diagram with a tongue-like profile in the frequency offset spectrum. In embodiments of the present invention, the analog filter has a high frequency cut-off, e.g., 320 MHz, with correspondingly small delay. Furthermore, since the bandwidth is user controllable through digital filtering, it is possible to control the effects of delay associated with the filtering.

For wander measurement, the super-stable clock/frequency reference is replaced with an external clock source, 636, such as from a Global Positioning System (GPS) source. Thus, the difference between jitter and wander measurement is that for jitter, the reference clock is a super-stable clock source, 634, while wander requires any external clock source. The selection of appropriate reference for the intended application is performed in selector 634.

An embodiment for clock recovery described with respect to FIG. 18 may simultaneously be used for jitter measurements when both sine and cosine signals are made available for further processing as required in clock recovery and jitter measurement implementations.

Jitter Generation

Figure 17:
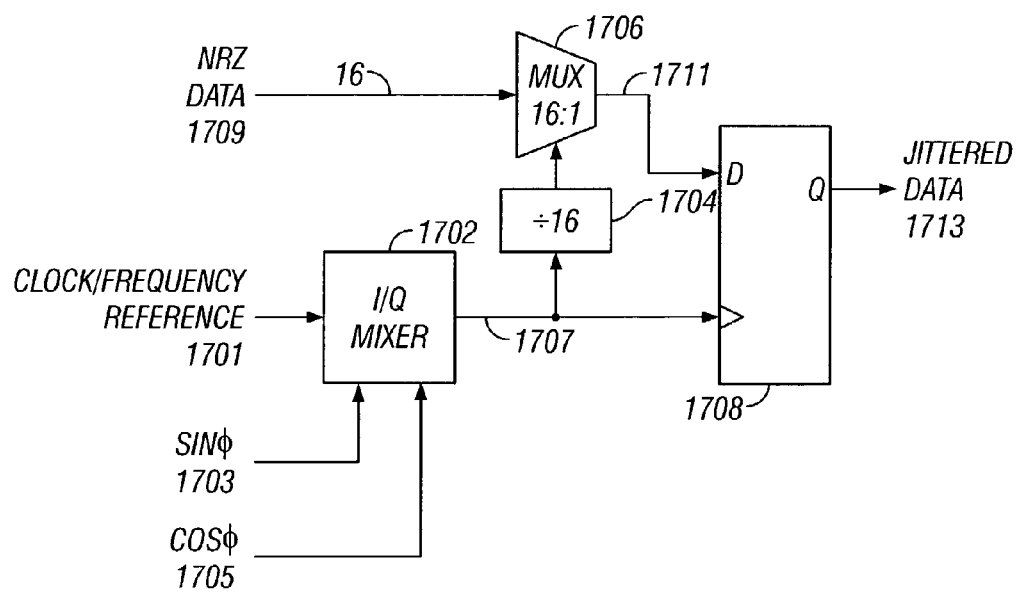
FIG. 17 is an illustration of a jitter generation method in accordance with an embodiment of the present invention.

To measure the integrity of test equipments, it is sometimes desirable to generate jittered data. FIG. 17 is an illustration of a jitter generation method in accordance with an embodiment of the present invention. As illustrated, super-stable clock/frequency reference 1701, sine of desired phase jitter 1703, and cosine of the desired phase jitter 1705 are fed into I/Q mixer 1702. The output of I/Q mixer 1702 is a phase modulated clock 1707 having the same underlying frequency as the clock/frequency reference 1701. This phase modulated clock 1707 is fed into the clock input of a D flip-flop, 1708. In addition, phase modulated clock 1707 is divided in block 1704 to provide the clock for multiplexer 1706. The divider value in block 1704 depends on the number of inputs of multiplexer 1706. Thus, in the illustration of FIG. 17, the divider value is 16 because multiplexer 1706 is a 16:1 MUX. Sixteen lines of NRZ data are provided as input to MUX 1706 thus producing multiplexed NRZ data 1711 which is fed into the data (i.e., D) input of D flip-flop 1708. D flip-flop 1708 thus generates a jittered NRZ output data. Additionally, NRZ data 1709 may be created by a device, such as an FPGA, which uses the divided clock frequency from block 1704 to provide bits at the jittered phase required by multiplexer 1706.

An Example General Purpose Test Equipment Configuration

Figure 11:
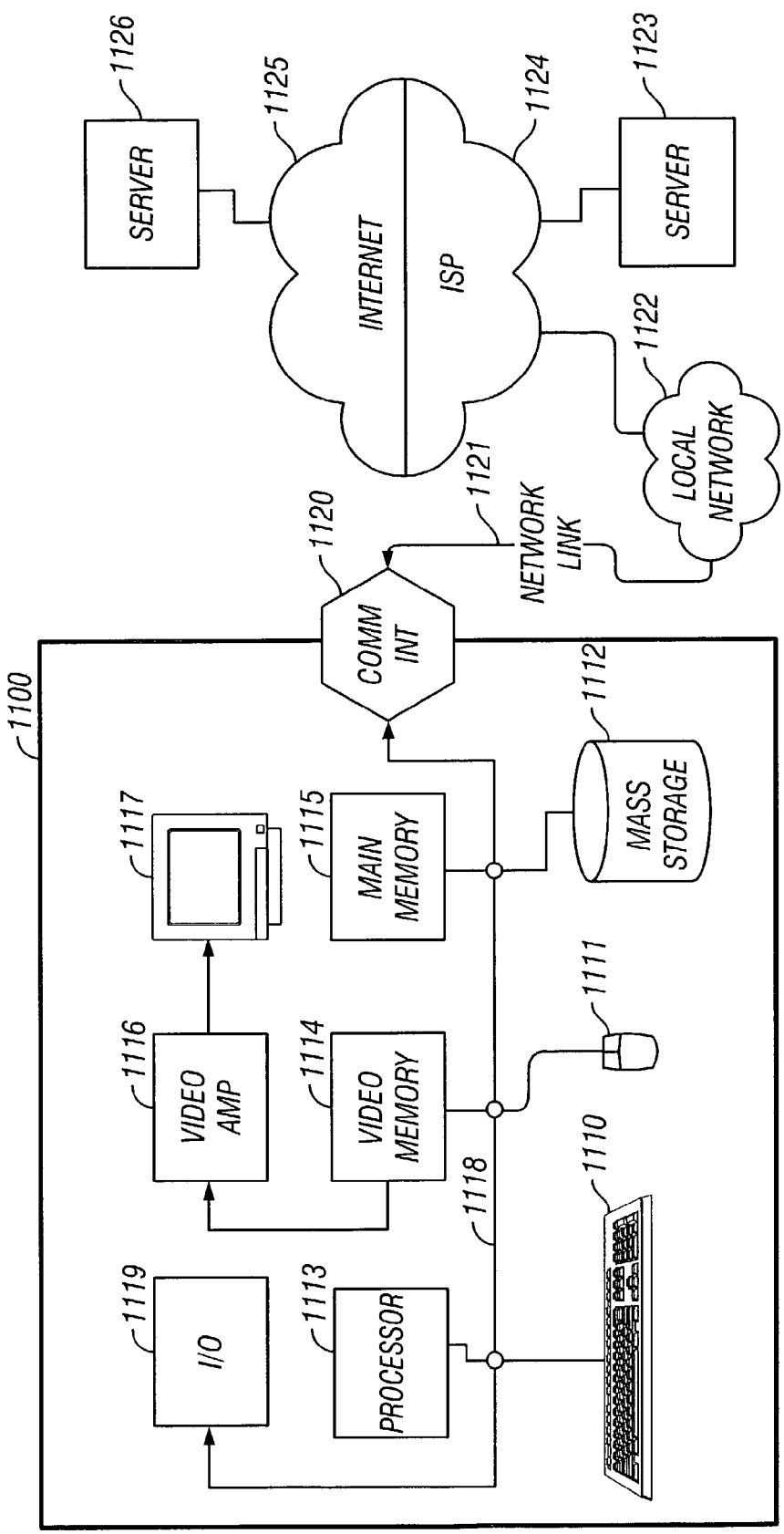
FIG. 11 is an example block diagram illustrating test equipment incorporating one or more embodiments of the invention.

An embodiment of the invention may be implemented on any computer processing platform, or in the form of software (e.g., bytecode class files) that is executable within a runtime environment running on such a processing platform. An example of implementation of test equipment incorporating an embodiment of the invention is illustrated in the computer of FIG. 11. The computer system (or test equipment) described below is for purposes of example only.

In FIG. 11, keyboard 1110 and mouse 1111 are coupled to system bus 1118. The keyboard and mouse are for introducing user input to the computer system (test equipment) and communicating that user input to processor 1113. Other suitable input devices may be used in addition to, or in place of, the mouse 1111 and keyboard 1110. For example, computer 1100 may be a set top box without a mouse or even keyboard. I/O (input/output) unit 1119 coupled to system bus 1118 represents such I/O elements as a printer, A/V (audio/video) I/O, inputs from A/D converters, outputs to D/A converters, etc.

Computer 1100 includes a video memory 1114, main memory 1115 and mass storage 1112, all coupled to system bus 1118 along with keyboard 1110, mouse 1111 and processor 1113. The mass storage 1112 may include both fixed and removable media, such as magnetic, optical or magnetic optical storage systems or any other available mass storage technology. Bus 1118 may contain, for example, address lines for addressing video memory 1114 or main memory 1115. The system bus 1118 also includes, for example, a data bus for transferring data between and among the components, such as processor 1113, main memory 1115, video memory 1114 and mass storage 1112. Alternatively, multiplexed data/address lines may be used instead of separate data and address lines.

In one embodiment of the invention, the processor 1113 is a SPARC™ microprocessor from Sun Microsystems, Inc. or a microprocessor manufactured by Intel, such as the 80X86, or Pentium processor, or a microprocessor manufactured by Motorola, such as the 680X0 processor. However, any other suitable microprocessor or microcomputer, such as FPGAs may be utilized. Main memory 1115 is comprised of dynamic random access memory (DRAM). Video memory 1114 is a dual-ported video random access memory. One port of the video memory 1114 is coupled to video amplifier 1116. The video amplifier 1116 is used to drive the cathode ray tube (CRT) raster monitor 1117. Video amplifier 1116 is well known in the art and may be implemented by any suitable apparatus. This circuitry converts pixel data stored in video memory 1114 to a raster signal suitable for use by monitor 1117. Monitor 1117 is a type of monitor suitable for displaying graphic images. Alternatively, the video memory could be used to drive a flat panel or liquid crystal display (LCD), or any other suitable data presentation device.

Computer 1100 may also include a communication interface 1120 coupled to bus 1118. Communication interface 1120 has a two-way data communication with the components of the test equipment 1100. Communication link 118 may be equivalent to programming link 432 (see FIG. 4). Communication interface 1120 includes connector 401 for receiving transmission data via a network link 1121 of a local network 1122. Embodiments of the invention may be implemented in communication interface 1120 thereby interfacing the user interface testing equipment 1100 with the transmission line, 1121, under test. In such implementation, network link 1121 may be an optical transmission link.

Network link 1121 typically provides data communication through one or more networks to other data devices. For example, network link 1121 may provide a connection through local network 1122 to local server computer 1123 or to data equipment operated by an Internet Service Provider (ISP) 1124. ISP 1124 may in turn provide data communication services through the world wide packet data communication network now commonly referred to as the "Internet" 1125. Local network 1122 and Internet 1125 both use electrical, electromagnetic or optical signals which carry digital data streams. The signals through the various networks and the signals on network link 1121 through communication interface 1120, which carry the optical data to computer/test equipment 1100, are exemplary forms of carrier waves transporting the information.

In one or more embodiments, HSPU 412 may be implemented inside computer 1100 thus minimizing the number of processors in computer 1100. In such embodiments, processor 1113 is a multi-purpose processor providing the high priority and deterministic function required by HSPU 412 and other test equipment processing functions.

Thus, a method and apparatus for physical layer transport testing of optical network components have been described in conjunction with one or more specific embodiments. The invention is defined by the claims and their full scope of equivalents.

The invention claimed is:

1. A method for testing network integrity of test equipment by generating jittered data, comprising:
   determining a desired phase jitter to be used for a data stream used to test test equipment;
   generating a sine of phase angle and a cosine of phase angle with respect to the desired phase jitter;
   inputting the sine of phase angle and the cosine of phase angle with respect to the desired phase jitter to a quadrature mixer, for which a reference clock waveform is also inputted thereto, and obtaining a phase modulated clock signal as a result thereof;
   inputting the phase modulated clock signal to a clock input of a flip-flop;
   dividing the phase modulated clock and providing the divided phase modulated clock to a select port of a multiplexer which receives an NRZ data stream on its input port;
   providing the multiplexed NRZ data stream obtained at an output port of the multiplexer to a data input of the flip-flop; and
   testing integrity of the test equipment by providing a jittered NRZ data stream to the test equipment as obtained from an output port of the flip-flop.

* * * * *